United States Patent
Yang et al.

(10) Patent No.: US 11,322,464 B2
(45) Date of Patent: May 3, 2022

(54) FILM STRUCTURE FOR BOND PAD

(71) Applicant: Taiwan Semiconductor Manufacturing Co., Ltd., Hsin-Chu (TW)

(72) Inventors: Julie Yang, Hsin-Chu (TW); Chii-Ming Wu, Taipei (TW); Tzu-Chung Tsai, Hsinchu County (TW); Yao-Wen Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 99 days.

(21) Appl. No.: 16/589,497

(22) Filed: Oct. 1, 2019

(65) Prior Publication Data
US 2021/0098398 A1    Apr. 1, 2021

(51) Int. Cl.
*H01L 23/00* (2006.01)

(52) U.S. Cl.
CPC .............. *H01L 24/05* (2013.01); *H01L 24/03* (2013.01); *H01L 24/13* (2013.01); *H01L 2224/02206* (2013.01); *H01L 2224/02215* (2013.01); *H01L 2224/03019* (2013.01); *H01L 2224/03614* (2013.01); *H01L 2224/0401* (2013.01); *H01L 2224/05082* (2013.01);
(Continued)

(58) Field of Classification Search
CPC ......... H01L 24/05; H01L 24/03; H01L 24/13; H01L 2224/02206; H01L 2224/02215; H01L 2224/03019; H01L 2224/03614; H01L 2224/0401; H01L 2224/05082; H01L 2224/05166; H01L 2224/13026; H01L 2924/04941; H01L 2924/05432
See application file for complete search history.

(56) References Cited

U.S. PATENT DOCUMENTS 10,037,949 B1 *  7/2018  Kim .................... H01L 21/6835
2008/0073681 A1  3/2008  Kanaya
(Continued)

FOREIGN PATENT DOCUMENTS

WO   WO-2010060684 A2 *  6/2010  ........... G01L 9/0042

OTHER PUBLICATIONS

SPTS Technologies Ltd. "Application Brief: Plasma Dicing." Published in 2016.

*Primary Examiner* — Peter Bradford
(74) *Attorney, Agent, or Firm* — Eschweiler & Potashnik, LLC

(57) ABSTRACT

The present disclosure, in some embodiments, relates to a method of forming an integrated chip. The method includes forming a plurality of bond pad structures over an interconnect structure on a front-side of a semiconductor body. The plurality of bond pad structures respectively have a titanium contact layer. The interconnect structure and the semiconductor body are patterned to define trenches extending into the semiconductor body. A dielectric fill material is formed within the trenches. The dielectric fill material is etched to expose the titanium contact layer prior to bonding the semiconductor body to a carrier substrate. The semiconductor body is thinned to expose the dielectric fill material along a back-side of the semiconductor body and to form a plurality of integrated chip die. The dielectric fill material is removed to separate the plurality of integrated chip die.

20 Claims, 15 Drawing Sheets

(52) U.S. Cl.
CPC ............... *H01L 2224/05166* (2013.01); *H01L 2224/13026* (2013.01); *H01L 2924/04941* (2013.01); *H01L 2924/05432* (2013.01)

(56) References Cited

U.S. PATENT DOCUMENTS

| | | | |
|---|---|---|---|
| 2008/0258306 A1* | 10/2008 | Chang | H01L 24/24 257/762 |
| 2009/0243097 A1* | 10/2009 | Koroku | H01L 23/3135 257/737 |
| 2010/0264414 A1 | 10/2010 | Homma et al. | |
| 2016/0013154 A1* | 1/2016 | Ma | H01L 21/563 257/777 |
| 2017/0098617 A1* | 4/2017 | Yu | H01L 21/4853 |
| 2017/0271242 A1 | 9/2017 | Lo et al. | |
| 2018/0151342 A1 | 5/2018 | Fan et al. | |
| 2018/0151527 A1 | 5/2018 | Chang et al. | |
| 2018/0323136 A1* | 11/2018 | Schmenn | H01L 21/4846 |
| 2019/0027452 A1* | 1/2019 | Ku | H01L 23/3185 |
| 2019/0051614 A1* | 2/2019 | Dimaano Jr | H01L 21/561 |
| 2019/0088550 A1* | 3/2019 | Ganitzer | H01L 23/481 |
| 2019/0096753 A1 | 3/2019 | Lin et al. | |
| 2019/0109074 A1* | 4/2019 | Manack | H01L 23/49 |
| 2019/0237454 A1* | 8/2019 | Hou | H01L 25/18 |

\* cited by examiner

US 11,322,464 B2

FILM STRUCTURE FOR BOND PAD

BACKGROUND

Integrated chip fabrication is a complex multiple-step process during which electronic circuits are formed on a wafer made out of a semiconducting material (e.g., silicon). Integrated chip fabrication can be broadly divided into front-end-of-line (FEOL) processing and back-end-of-line (BEOL) processing. FEOL processing generally relates to the formation of devices (e.g., transistors) within the semiconductor material, while BEOL processing generally relates to the formation of conductive interconnects within a dielectric structure over the semiconductor material. After BEOL processing is completed, bond pads are formed and then the wafer may be singulated (e.g., diced) to form a plurality of separate integrated chip die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
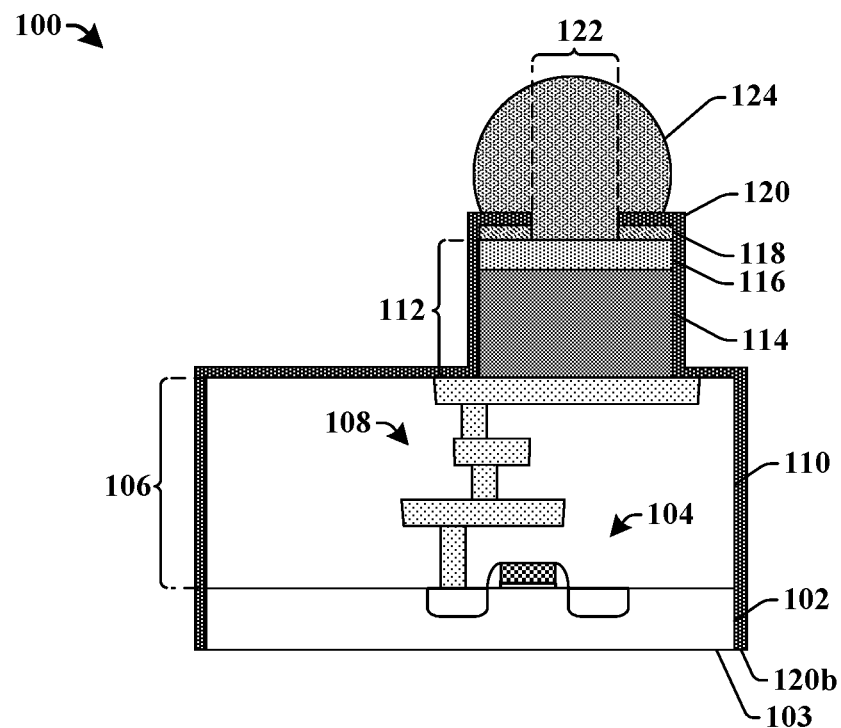
FIG. 1 illustrates a cross-sectional view of some embodiments of an integrated chip die having a bond pad structure comprising a contact layer that is resistant to fluorine based etchants.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips are typically fabricated by forming transistor devices within a semiconductor wafer and subsequently forming an interconnect structure over the semiconductor wafer. The interconnect structure includes a plurality of conductive interconnect layers that increase in size as a distance from the semiconductor wafer increases. The interconnect layers terminate at a bond pad formed over a top of the interconnect structure. After forming the bond pad, the semiconductor wafer may be singulated by a dicing process that cuts the wafer into a plurality of separate integrated chip die. The dicing process may be performed by mounting the wafer onto a sticky surface of a piece of dicing tape. A wafer saw then cuts the wafer along scribe lines to separate the wafer into the separate integrated chip die.

Because a wafer sawing process may cause mechanical stress on a wafer, a crack-stop may be arranged within the interconnect structure along an outer perimeter of each integrated chip die of the wafer. The crack-stop includes a dense arrangement of conductive interconnect layers configured to prevent cracks caused by a wafer dicing process from propagating into an interior of an integrated chip die. It has been appreciated that traditional dicing processes may be undesirable for integrated chip die having a relatively small size (e.g., less than 5 mm$^2$), because a size of a crack stop will consume a proportionally large area of the integrated chip die.

Therefore, an alternative to traditional dicing processes can be to etch deep trenches between adjacent integrated chip die within a wafer. The deep trenches may extend through an interconnect structure and into a front side of the wafer. The trenches are filled with a dielectric material prior to thinning a back-side of the wafer to expose the dielectric material within the trenches. The dielectric material is then acted upon by a fluorine based gas to remove the dielectric material and separate the adjacent integrated chip die. In some processes, bond pads may be formed within an integrated chip die prior to forming the deep trenches. The bond pads may be formed by depositing a bond pad stack comprising an aluminum-copper layer disposed between an underlying titanium layer and an overlying titanium-nitride layer. The bond pad stack is subsequently patterned according to a silicon oxynitride hard mask to define the bond pads. The titanium-nitride layer protects the aluminum-copper layer during patterning of the bond pads and is subsequently etched to uncover the aluminum-copper layer prior to exposing the dielectric material to the fluorine based gas.

While the titanium-nitride layer protects the aluminum-copper layer during patterning, etchants used to remove the silicon oxynitride hard mask can pass through the titanium-nitride layer and damage the underlying aluminum-copper layer. The damage to the aluminum-copper layer can increase a resistance of the aluminum-copper layer and the bond pads. Furthermore, the fluorine based gas used to remove the dielectric material may interact with the exposed aluminum-copper layer and leave a byproduct (e.g., a AlxFy byproduct) on the aluminum-copper layer, which can further increase the resistance of the aluminum-copper layer (e.g., to a resistance that is greater than or equal to 100 ohm). The increased resistance of the aluminum-copper layer and the bond pad can increase a power consumption of an integrated chip, thereby reducing performance and/or battery life of a device using the integrated chip.

The present disclosure relates to a method of forming an integrated chip die having a low resistance bond pad (e.g., a bond pad having a resistance of less than approximately 20 ohms). In some embodiments, the method forms a bond pad stack onto an interconnect structure over a semiconductor body. The bond pad stack may include a titanium contact layer. The bond pad stack is selectively etched according to a first masking layer to define bond pad structures. An etching process is then performed to form trenches extending through the interconnect structure and into the semiconductor body. The trenches are filled with a dielectric material, and the titanium contact layer is exposed by etching the dielectric material and the first masking layer. A back-side of the semiconductor body is subsequently thinned, to expose the dielectric material within the trenches, before acting on the dielectric material with a fluorine based gas to remove the dielectric material and separate the semiconductor body into a plurality of integrated chip die. Because the first masking layer is left in place after defining the bond pad structures, damage to the titanium contact layer is reduced. Furthermore, the titanium contact layer is largely resistant to damage and/or formation of a byproduct due to the fluorine based gas, so that the titanium contact layer has a lower resistance than a damaged aluminum-copper layer.

FIG. 1 illustrates a cross-sectional view of some embodiments of an integrated chip die 100 having a bond pad structure comprising a contact layer that is resistant to fluorine based etchants.

The integrated chip die 100 comprises a transistor device 104 arranged within a substrate 102. An interconnect structure 106 is arranged over the substrate 102 and surrounds the transistor device 104. The interconnect structure 106 comprises a plurality of interconnect layers 108 disposed within a dielectric structure 110. The plurality of interconnect layers 108 are electrically coupled to the transistor device 104. In some embodiments, the transistor device 104 may comprise a MOSFET, a bi-polar junction transistor (BJT), a high electron mobility transistor (HEMT), or the like.

A bond pad structure 112 is arranged over the interconnect structure 106. The bond pad structure 112 comprises one or more conductive layers 114 electrically coupled to the plurality of interconnect layers 108. The bond pad structure 112 further comprises a contact layer 116 disposed over the one or more conductive layers 114. The contact layer 116 is largely resistant fluorine based etchants, such that a fluorine based etchant (e.g., a vapor hydrofluoric acid) will not form a byproduct on the contact layer 116. For example, in some embodiments, the contact layer 116 may comprise titanium, chromium, platinum, gold, or the like. In some embodiments, the contact layer 116 may comprise a metal alloy that is devoid of aluminum and/or copper.

A first masking layer 118 is disposed over the contact layer 116 and a second masking layer 120 is disposed over the first masking layer 118. In some embodiments, the first masking layer 118 is completely confined over the contact layer 116. The first masking layer 118 and the second masking layer 120 have sidewalls that define an opening 122 that extends through the first masking layer 118 and the second masking layer 120 to the contact layer 116. In some embodiments, the second masking layer 120 continuously extends from directly over the contact layer 116 to along sidewalls of the bond pad structure 112, sidewalls of the interconnect structure 106, and sidewalls of the substrate 102. In some embodiments, the second masking layer 120 may extend to a horizontal line disposed along a bottommost surface 103 of the substrate 102. In some embodiments, the second masking layer 120 may have a bottommost 120b surface that is substantially co-planar with the bottommost surface 103 of the substrate 102.

In some embodiments, the first masking layer 118 and the second masking layer 120 may comprise or be a same material. For example, the first masking layer 118 and the second masking layer 120 may comprise or be a metal-oxide, such as aluminum-oxide, magnesium-oxide, iron-oxide, or the like. In other embodiments, first masking layer 118 and the second masking layer 120 may comprise or be different materials. For example, the first masking layer 118 and the second masking layer 120 may comprise or be different metal-oxides.

A conductive bump 124 is disposed on the contact layer 116. The conductive bump 124 vertically extends from the contact layer 116 to over the first masking layer 118 and the second masking layer 120. The conductive bump 124 is configured to electrically couple the contact layer 116 to another substrate (e.g., an integrated chip die, a package substrate, and interposer substrate, or the like).

Keeping the first masking layer 118 over the contact layer 116 during fabrication of the integrated chip die 100 can prevent damage to the contact layer 116. Moreover, during the fabrication process the upper surface of the contact layer 116 may be exposed to fluorine based etchants (e.g., vapor hydrofluoric acid). Because the contact layer 116 is a material that is largely resistant to fluorine based etchants the formation of byproducts on the contact layer 116 is prevented, resulting in a contact layer 116 that is not covered by fluorine based byproducts. By preventing the formation of byproducts on the contact layer 116, a resistance of the contact layer 116 can be kept relatively low (e.g., less than or equal to approximately 12 ohms). Furthermore, omitting an aluminum-copper layer from the bond pad structure 112 may reduce a number of deposition processes used in its formation and thereby reduce a cost of forming the bond pad structure 112.

Figure 2A:
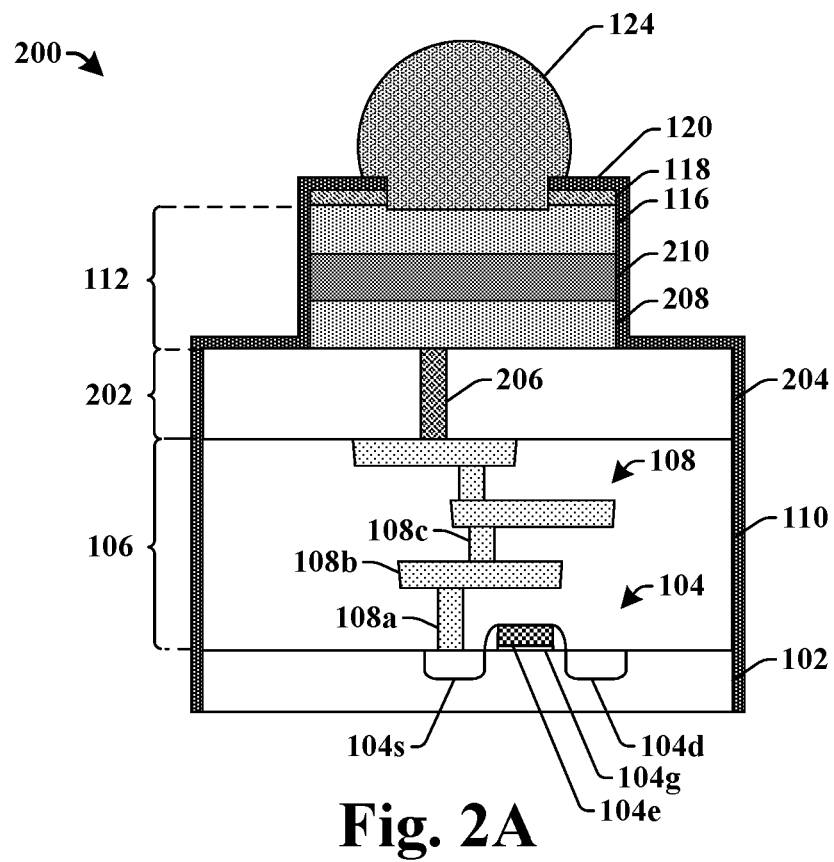
FIGS. 2A-2B illustrate cross-sectional views of some additional embodiments of integrated chip die having a disclosed bond pad structure.

FIG. 2A illustrates a cross-sectional view of some additional embodiments of an integrated chip die 200 having a bond pad structure comprising a contact layer that is resistant to fluorine based etchants.

The integrated chip die 200 comprises a transistor device 104 arranged within a substrate 102. In some embodiments, the transistor device 104 comprises a source region 104s and a drain region 104d disposed within the substrate 102. A gate electrode 104e is arranged over the substrate 102 at a position that is between the source region 104s and the drain region 104d. The gate electrode 104e is separated from the substrate 102 by way of a gate dielectric layer 104g.

An interconnect structure 106 is arranged over the substrate 102 and surrounds the gate electrode 104e of the transistor device 104. The interconnect structure 106 comprises a plurality of interconnect layers 108 disposed within a dielectric structure 110. In some embodiments, the plurality of interconnect layers 108 may comprise conductive contacts 108a, interconnect wires 108b, and interconnect vias 108c. In some embodiments, the plurality of interconnect layers 108 may comprise copper, tungsten, aluminum, or the like. In some embodiments, the dielectric structure 110 may comprise a plurality of stacked inter-level dielectric (ILD) layers vertically separated from one another by etch stop layers. In some embodiments, the plurality of stacked ILD layers may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like. In some embodiments, the interconnect structure 106 does not have a crack-stop region around a perimeter of the integrated chip die 200.

A redistribution structure 202 is disposed over the interconnect structure 106. The redistribution structure 202 comprises a passivation layer 204 surrounding a conductive redistribution layer 206. In some embodiments, the passivation layer 204 may comprise a nitride (e.g., silicon oxynitride), a carbide (e.g., silicon oxycarbide), an oxide (e.g., PESiON), or the like. In some embodiments, the conductive redistribution layer 206 may comprise a conductive contact having sidewalls that vertically extend completely through the passivation layer 204. In some embodiments, the conductive redistribution layer 206 may comprise tungsten. In other embodiments, the conductive redistribution layer 206 may additionally or alternatively comprise one or more other types of metal (e.g., aluminum, copper, etc.)

A bond pad structure 112 is disposed over the redistribution structure 202. In some embodiments, the bond pad structure 112 may comprise a first conductive layer 208, a diffusion barrier layer 210 disposed over the first conductive layer 208, and a contact layer 116 disposed over the diffusion barrier layer 210 and comprising a material that is resistant to fluorine based etchants. In some embodiments, the first conductive layer 208 may comprise or be titanium. In some embodiments, the diffusion barrier layer 210 may comprise or be titanium nitride. In some embodiments, the contact layer 116 may comprise or be titanium. In some embodiments, the first conductive layer 208 may have a thickness in a range of between approximately 50 angstroms and approximately 150 angstroms. In some embodiments, the diffusion barrier layer 210 may have a thickness in a range of between approximately 100 angstroms and approximately 5000 angstroms. In some embodiments, the contact layer 116 may have a thickness in a range of between approximately 100 angstroms and approximately 5000 angstroms.

A first masking layer 118 is disposed over the bond pad structure 112. The first masking layer 118 has interior sidewalls that are disposed directly over an upper surface of the bond pad structure 112 and outermost sidewalls that are substantially aligned with outermost sidewalls of the bond pad structure 112. In some embodiments, the contact layer 116 may have a greater thickness directly below the first masking layer 118 than laterally outside of the first masking layer 118 (e.g., between the interior sidewalls of the first masking layer 118). In some embodiments, the first masking layer 118 may have a thickness in a range of between approximately 150 angstroms and approximately 450 angstroms. In other embodiments, the first masking layer 118 may have a thickness of approximately 300 angstroms.

A second masking layer 120 is disposed over the first masking layer 118. The second masking layer 120 has interior sidewalls that are disposed directly over the upper surface of the bond pad structure 112. The second masking layer 120 extends along outermost sidewalls of the bond pad structure 112 and over a top of the redistribution structure 202. In some embodiments, the second masking layer 120 may have a thickness in a range of between approximately 150 angstroms and approximately 450 angstroms. In other embodiments, the second masking layer 120 may have a thickness of approximately 300 angstroms.

Figure 2B:
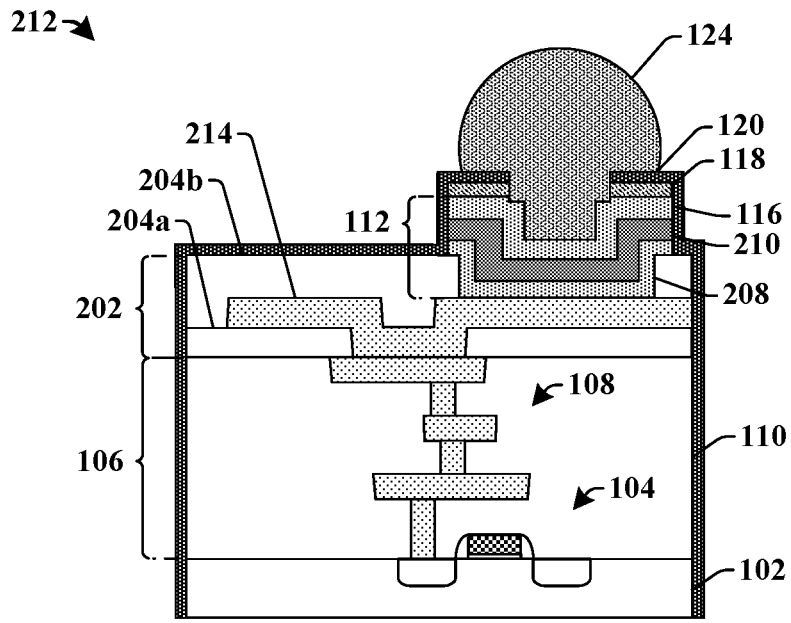

FIG. 2B illustrates a cross-sectional view of some additional embodiments of an integrated chip die 212 having a bond pad structure comprising a contact layer that is resistant to fluorine based etchants.

The integrated chip die 212 comprises a redistribution structure 202 disposed over the interconnect structure 106 that includes a plurality of interconnect layers 108 within a dielectric structure 110 over a substrate 102. The redistribution structure 202 comprises a first passivation layer 204a having sidewalls that define a first opening directly over one of the plurality of interconnect layers 108. A conductive redistribution layer 214 is disposed over an upper surface of the first passivation layer 204a and extends through the first opening to the plurality of interconnect layers 108. In some embodiments, the conductive redistribution layer 214 may comprise a vertically extending segment extending through the first opening and a horizontally extending segment protruding outward from a sidewall of the vertically extending segment. A second passivation layer 204b is disposed over the first passivation layer 204a and the conductive redistribution layer 214. The second passivation layer 204b has sidewalls that define a second opening directly over the conductive redistribution layer 214.

A bond pad structure 112 is disposed over an upper surface of the second passivation layer 204b and extends through the second opening to the conductive redistribution layer 214. The bond pad structure 112 comprises a first conductive layer 208, a diffusion barrier layer 210 disposed over the first conductive layer 208, and a contact layer 116 disposed over the diffusion barrier layer 210. The first conductive layer 208, the diffusion barrier layer 210, and the contact layer 116 generally conform to the sidewalls and an upper surface of the second passivation layer 204b. The contact layer 116 has interior sidewalls coupled to a horizontally extending surface to define a recess within an upper surface of the contact layer 116. A conductive bump 124 fills the recess and extends from within the recess to over a second passivation layer 204b.

Figure 3:
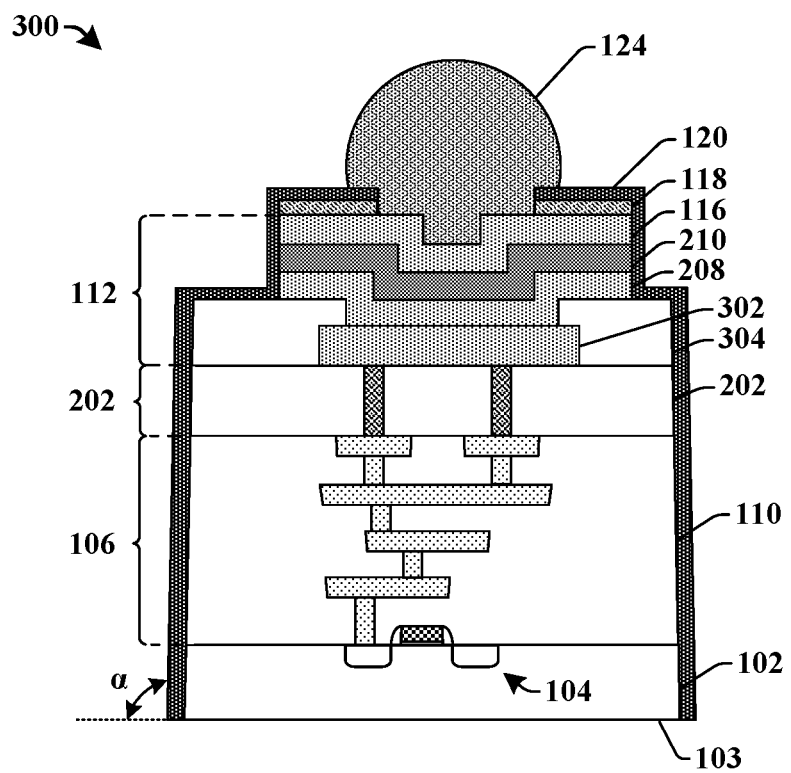
FIG. 3 illustrates a cross-sectional view of some additional embodiments of an integrated chip die having a disclosed bond pad structure.

FIG. 3 illustrates a cross-sectional view of some additional embodiments of an integrated chip die 300 having a bond pad structure comprising a contact layer that is resistant to fluorine based etchants.

The integrated chip die 300 comprises an interconnect structure 106 including a dielectric structure 110 arranged over a substrate 102. A redistribution structure 202 comprising a passivation layer 204 is disposed over the interconnect structure 106. In some embodiments, the passivation layer 204, the dielectric structure 110, and the substrate 102 may have sidewalls that are angled at an obtuse angle $\alpha$ with respect to a bottommost surface of the substrate 102. For example, in some embodiments, the obtuse angle $\alpha$ may be in a range of between 90° and approximately 95°. In some embodiments (not shown), the sidewalls of the passivation layer 204, the dielectric structure 110, and the substrate 102 may have a scalloped profile comprising plurality of arced surfaces.

The redistribution structure 202 couples the interconnect structure 106 to a bond pad structure 112. The bond pad structure 112 comprises a conductive bonding pad 302, which is laterally surrounded by an additional passivation layer 304. The additional passivation layer 304 continuously extends from along sidewalls of the conductive bonding pad 302 to over the conductive bonding pad 302. The additional passivation layer 304 comprises sidewalls that are disposed over the conductive bonding pad 302 and that define an opening within the additional passivation layer 304. A first conductive layer 208 is disposed over the additional passivation layer 304 and extends through the opening to the conductive bonding pad 302. A diffusion barrier layer 210 is disposed over the first conductive layer 208 and a contact layer 116 is disposed over the diffusion barrier layer 210.

Figure 4:
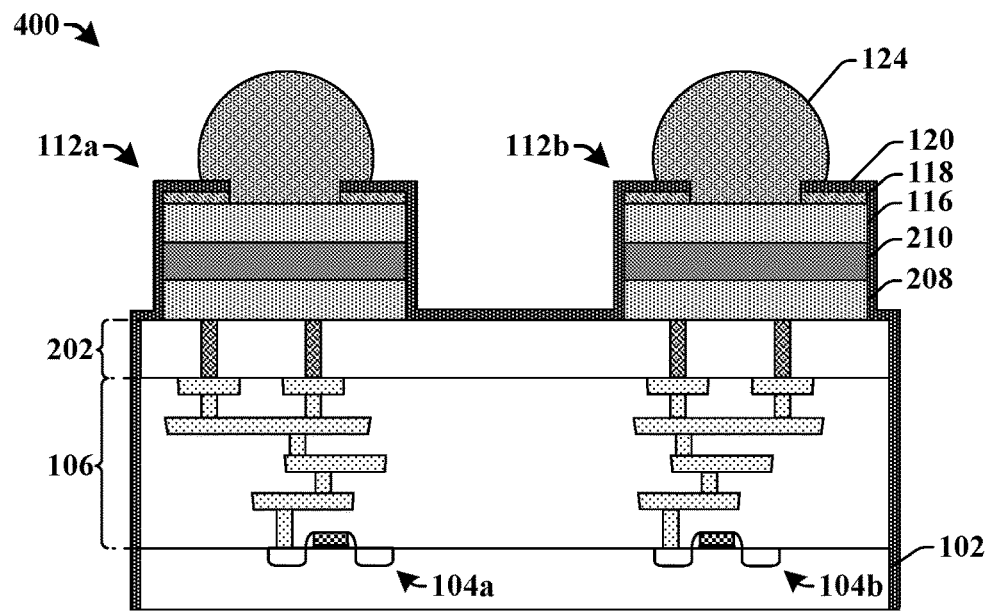
FIG. 4 illustrates a cross-sectional view of some additional embodiments of an integrated chip die having a disclosed bond pad structure.

FIG. 4 illustrates a cross-sectional view of some additional embodiments of an integrated chip die 400 having a bond pad structure comprising a contact layer that is resistant to fluorine based etchants.

The integrated chip die 400 comprises a plurality of transistor devices 104a-104b disposed within a substrate 102. A plurality of bond pad structure 112a-112b are arranged over a redistribution structure 202 overlying the substrate 102. The plurality of bond pad structures 112a-112b comprise a first bond pad structure 112a electrically coupled to a first transistor 104a and a second bond pad structure 112b electrically coupled to a second transistor 104b. The first bond pad structure 112a has outermost sidewalls that are laterally separated from outermost sidewalls of the second bond pad structure 112b by a non-zero distance.

A first masking layer 118 is disposed over the first bond pad structure 112a and the second bond pad structure 112b. A second masking layer 120 is disposed on the first masking layer 118. The second masking layer 120 extends along the outermost sidewalls of the first bond pad structure 112a and the second bond pad structure 112b.

Figure 5:
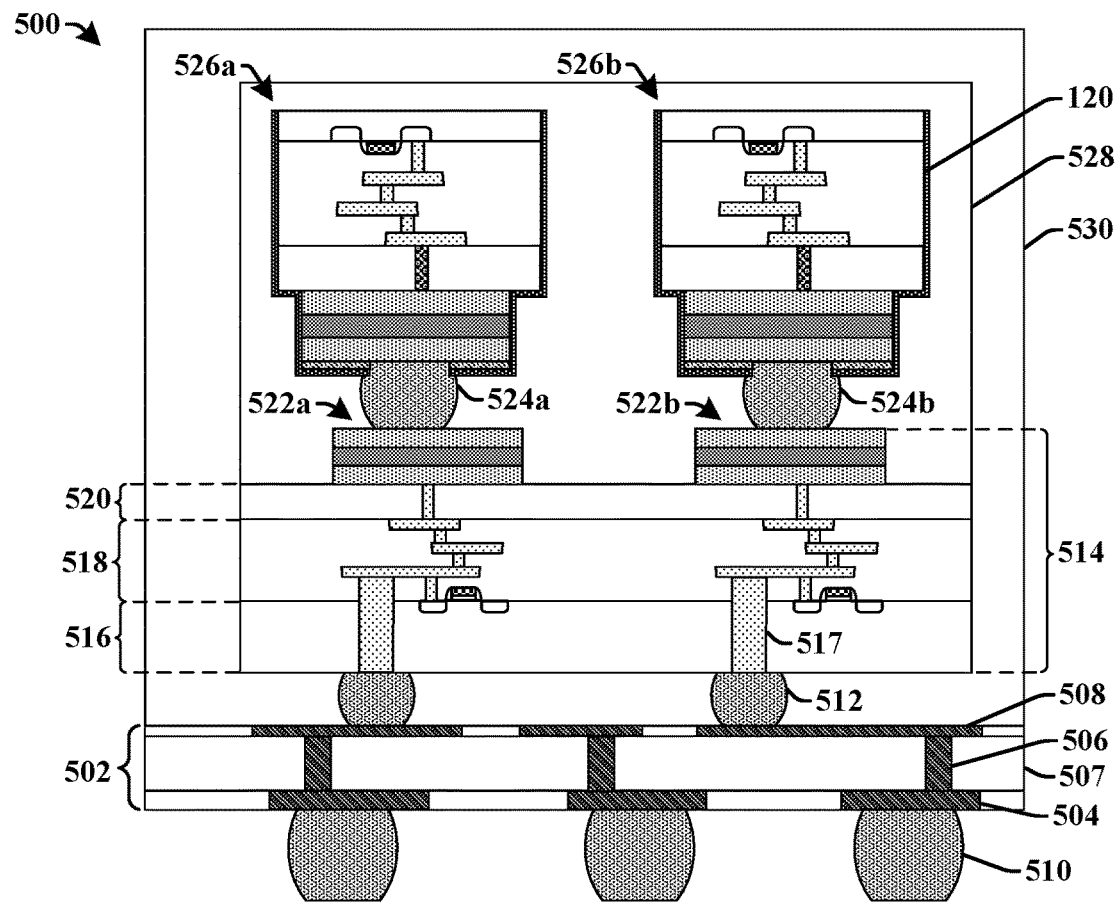
FIG. 5 illustrates a cross-sectional view of some embodiments of an integrated chip package comprising a disclosed integrated chip die.
Figure 6B:
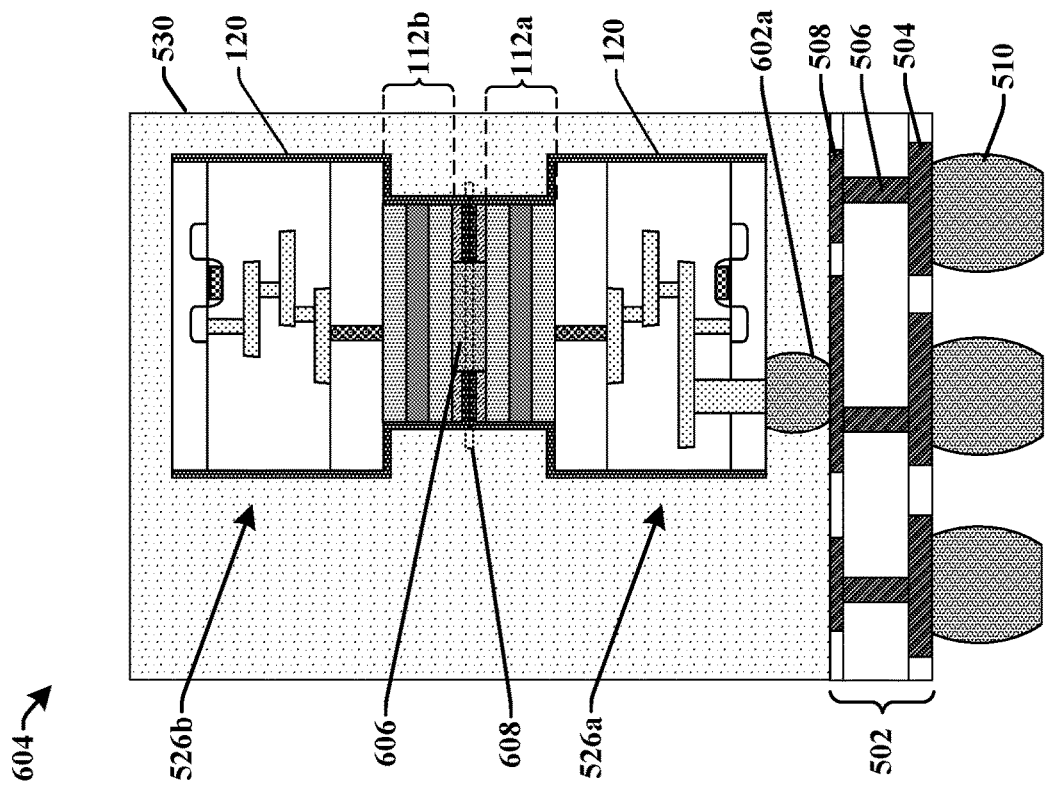
FIGS. 6A-6B illustrate cross-sectional views of some additional embodiments of integrated chip packages respectively having a plurality of disclosed integrated chip die.

FIGS. 5-6B illustrates some embodiments of an integrated chip package comprising a disclosed integrated chip die. It will be appreciated that FIGS. 5-6B are examples of some packages that may be used, but that the integrated chip die is not limited to such packages and rather may be implemented into a wide range of packages.

FIG. 5 illustrates a cross-sectional view of some embodiments of an integrated chip package 500 comprising a disclosed integrated chip die.

The integrated chip package 500 comprises a package substrate 502 having a first horizontal routing layer 504 coupled to a second horizontal routing layer 508 by way of a vertical routing layer 506 extending through a substrate 507. The first horizontal routing layer 504 is coupled to a plurality of solder bumps 510. The second horizontal routing layer 508 is coupled to one or more bump structures 512, which are further coupled to an integrated chip die 514 disposed over the package substrate 502. In various embodiments, the one or more bump structures 512 may comprise solder bumps, copper posts, micro-bumps (having widths in a range from about 5 μm to about 30 μm), or other applicable bump structures.

The integrated chip die 514 comprises an interconnect structure 518 disposed over a substrate 516. In some embodiments, interconnect layers within the interconnect structure 518 are coupled to the one or more bump structures 512 by way of through substrate vias (TSVs) 517 extending through the substrate 516. A redistribution structure 520 couples the interconnect structure 518 to a first bond pad 522a and a second bond pad 522b. The first bond pad 522a and the second bond pad 522b are respectively further coupled to a first micro-bump 524a and a second micro-bump 524b. The first micro-bump 524a couples the integrated chip die 514 to a first integrated chip die 526a and the second micro-bump 524b couples the integrated chip die 514 to a second integrated chip die 526b. The first integrated chip die 526a and the second integrated chip die 526b respectively comprise a second masking layer 120 that is disposed along outer sidewalls of the first integrated chip die 526a and the second integrated chip die 526b.

A dielectric material 528 is disposed over the integrated chip die 514 and surrounds the first integrated chip die 526a and the second integrated chip die 526b. In some embodiments, the dielectric material 528 may contact the second masking layer 120 along opposing sides of the first integrated chip die 526a and the second integrated chip die 526b. In various embodiments, the dielectric material 528 may comprise an oxide, a polymer, a resin, or the like. A molding compound 530 is disposed over the package substrate 502 and surrounds the dielectric material 528. In various embodiments, the molding compound 530 may comprise a polymer, a resin, or the like.

Figure 6A:
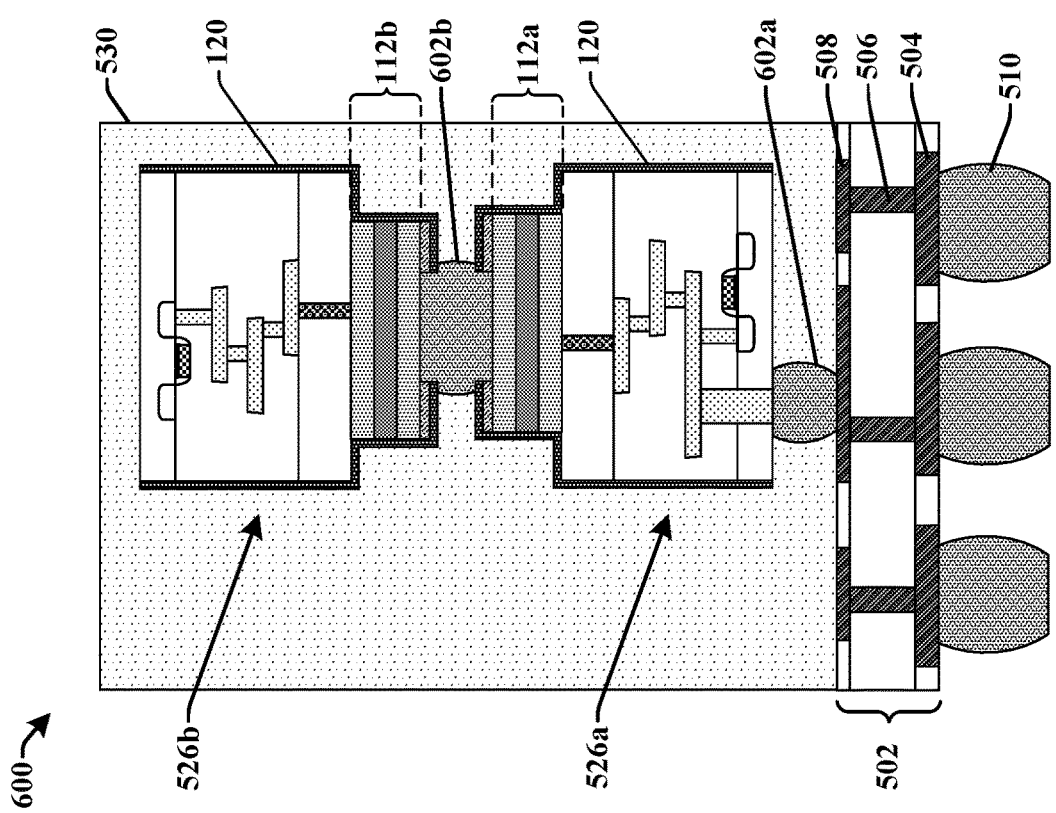

FIG. 6A illustrates a cross-sectional view of some additional embodiments of an integrated chip package 600 having a plurality of integrated chip die.

The integrated chip package 600 comprises a first integrated chip die 526a coupled to a package substrate 502 by way of a first micro-bump 602a. The first integrated chip die 526a comprises a first bond pad structure 112a that is coupled to a second micro-bump 602b. The second micro-bump 602b is further coupled to a second bond pad structure 112b of a second integrated chip die 526b. A molding compound 530 is disposed over the package substrate 502 and surrounds the first integrated chip die 526a and the second integrated chip die 526b.

FIG. 6B illustrates a cross-sectional view of some additional embodiments of an integrated chip package 604 having a plurality of integrated chip die.

The integrated chip package 604 comprises a first integrated chip die 526a coupled to a package substrate 502 by way of a first micro-bump 602a. The first integrated chip die 526a comprises a first bond pad structure 112a that is coupled to a conductive bonding structure 606. The conductive bonding structure 606 is further coupled to a second bond pad structure 112b of a second integrated chip die 526b. The first integrated chip die 526a and the second integrated chip die 526b are respectively surrounded by a second masking layer 120. The second masking layer 120 surrounding the first integrated chip die 526a and the second masking layer 120 surrounding the second integrated chip die 526b contact one another along a hybrid bonding interface 608 comprising the conductive bonding structure 606 and the second masking layer 120.

FIGS. 7-21D illustrate cross-sectional views 700-2100 of some embodiments of a method of forming an integrated chip die having a bond pad structure comprising a contact layer that is resistant to fluorine based etchants. Although FIGS. 7-21 are described in relation to a method, it will be appreciated that the structures disclosed in FIGS. 7-21 are not limited to such a method, but instead may stand alone as structures independent of the method.

Figure 7:
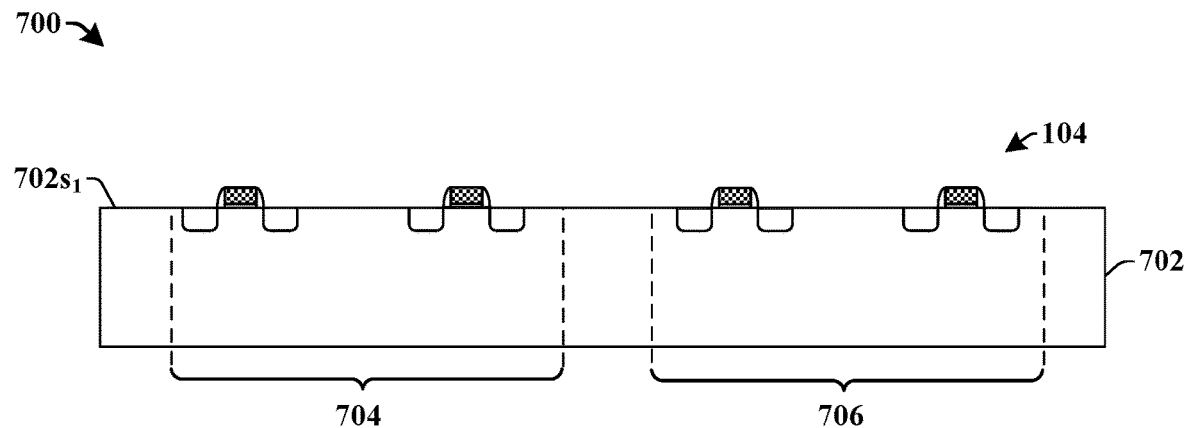
FIGS. 7-21D illustrate cross-sectional views of some embodiments of a method of forming an integrated chip die having a bond pad structure comprising a contact layer that is resistant to fluorine based etchants.

As shown in cross-sectional view 700 of FIG. 7, a semiconductor body 702 is provided. In various embodiments, the semiconductor body 702 may be any type of substrate (e.g., silicon, SiGe, SOI, etc.), such as a semiconductor wafer, as well as any other type of semiconductor and/or epitaxial layers, associated therewith. The semiconductor body 702 comprises a plurality of integrated chip die regions 704-706. A plurality of transistor devices 104 are formed along a first side 702si (e.g., a front-side) of the semiconductor body 702 within each of the plurality of integrated chip die regions 704-706.

Figure 8:
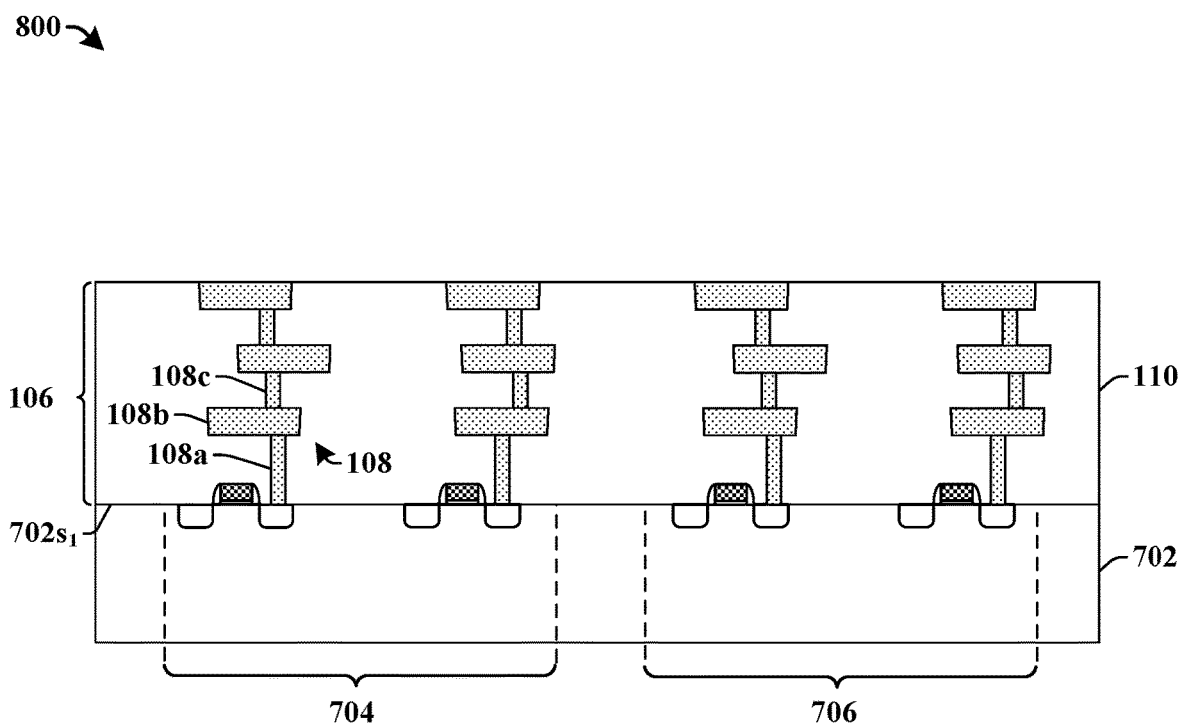

As shown in cross-sectional view 800 of FIG. 8, an interconnect structure 106 is formed along the first side 702si of the semiconductor body 702. The interconnect structure 106 comprises a plurality of interconnect layers 108 formed within a dielectric structure 110. In some embodiments, the dielectric structure 110 may comprise a plurality of stacked inter-level dielectric (ILD) layers formed over the semiconductor body 702. In some embodiments (not shown), the plurality of stacked ILD layers are separated by etch stop layers. In some embodiments, the plurality of interconnect layers 108 may comprise a conductive contact 108a, an interconnect wire 108b, and an interconnect via 108c. The plurality of interconnect layers 108 may be formed by forming one of the one or more ILD layers over the semiconductor body 702 (e.g., an oxide, a low-k dielectric, or an ultra low-k dielectric), selectively etching the ILD layer to define a via hole and/or a trench within the ILD layer, forming a conductive material (e.g., copper, aluminum, etc.) within the via hole and/or the trench, and performing a planarization process (e.g., a chemical mechanical planarization process).

Figure 9:
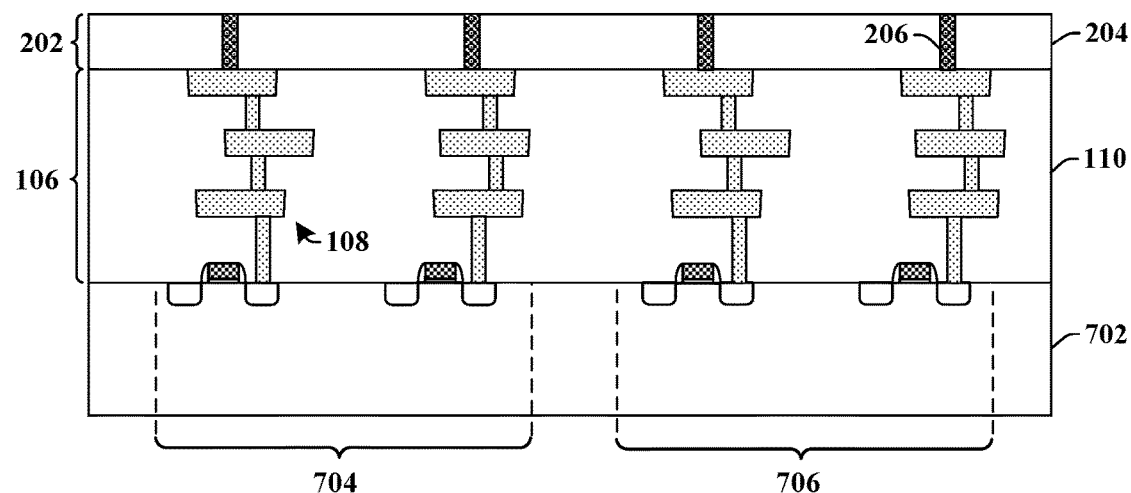

As shown in cross-sectional view 900 of FIG. 9, a redistribution structure 202 is formed over the interconnect structure 106. In some embodiments, the redistribution structure 202 may be formed by depositing a passivation layer 204 over the interconnect structure 106. The passivation layer 204 is subsequently etched to expose one or more of the plurality of interconnect layers 108 within the interconnect structure 106. A conductive material (e.g., tungsten) is deposited over the passivation layer 204. A part of the conductive material is subsequently removed to define a conductive redistribution layer 206 within the redistribution structure 202.

Figure 10:
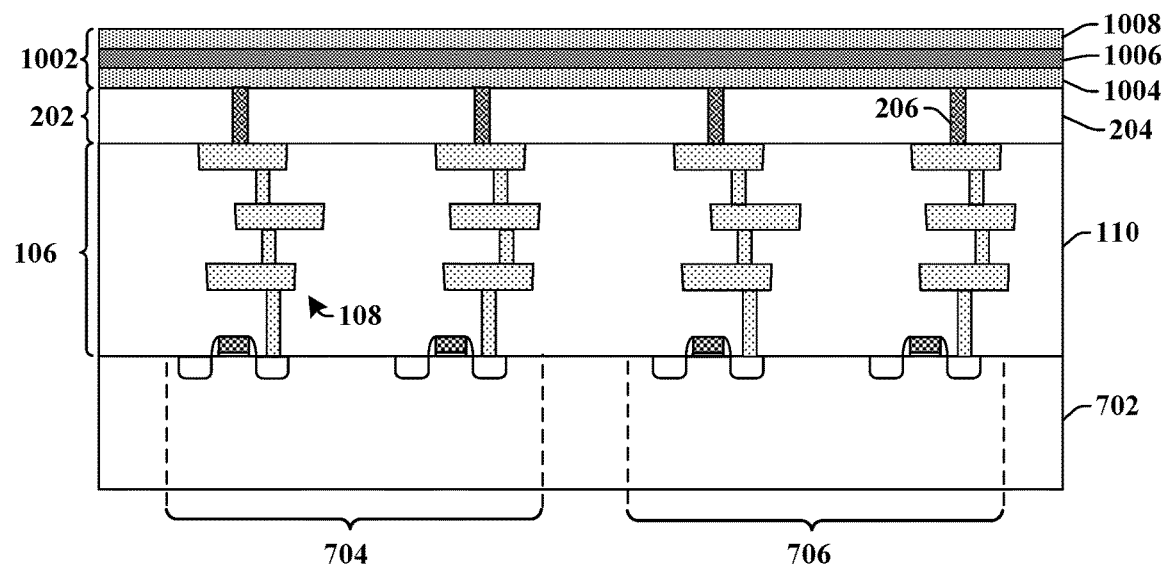

As shown in cross-sectional view 1000 of FIG. 10, a bond pad stack 1002 comprising a contact layer 1008 is formed over the redistribution structure 202. In some embodiments, the bond pad stack 1002 may comprise a first conductive layer 1004, a diffusion barrier layer 1006 disposed over the first conductive layer 1004, and a contact layer 1008 disposed over the diffusion barrier layer 1006. In some embodiments, the first conductive layer 1004 may comprise a metal, such as titanium, tantalum, or the like. In some embodiments, the diffusion barrier layer 1006 may comprise a metal-nitride, such as titanium nitride, tantalum nitride, or the like. The contact layer 1008 is a conductive material that is largely resistant fluorine based etchants. For example, in some embodiments, the contact layer 1008 may comprise or be titanium, chromium, platinum, gold, or the like. In some embodiments, the contact layer 1008 may comprise a metal alloy that is devoid of aluminum and/or copper. In some embodiments, the bond pad stack 1002 may be formed by a plurality of deposition processes (e.g., CVD, PVD, sputtering, PE-CVD, or the like).

Figure 11:
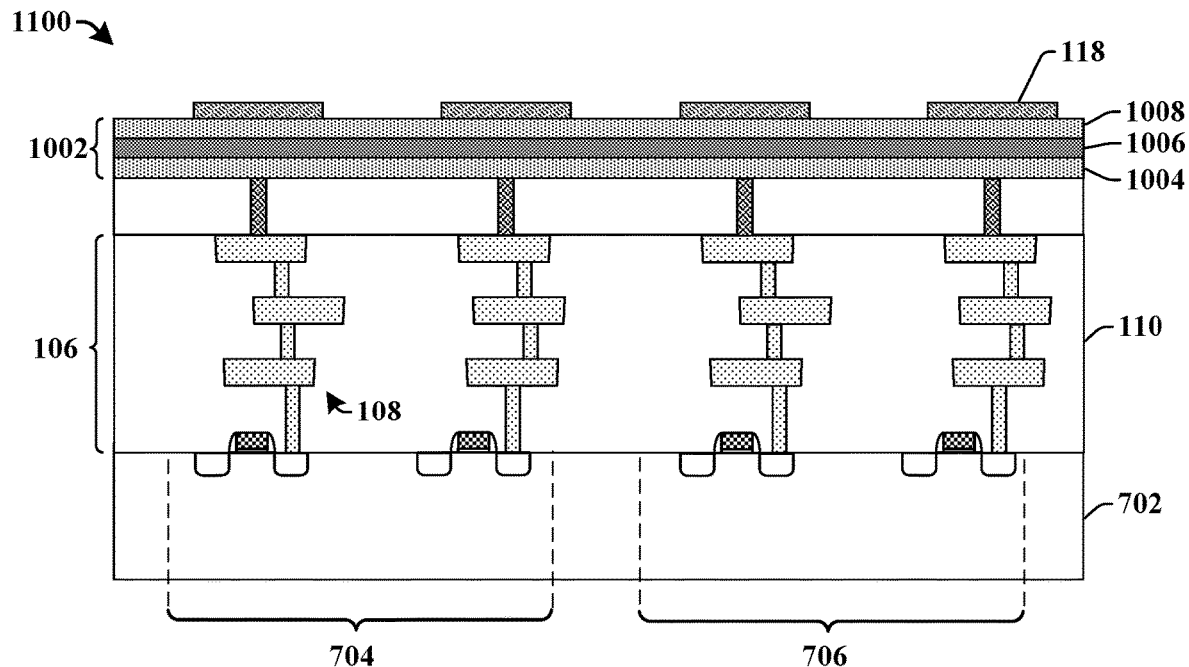

As shown in cross-sectional view 1100 of FIG. 11, a first masking layer 118 is formed over the bond pad stack 1002. In some embodiments, the first masking layer 118 may comprise a metal-oxide, such as aluminum oxide, magnesium oxide, or the like. The first masking layer 118 may be formed by depositing a first masking material over the bond pad stack 1002, and performing a lithographic patterning process to pattern the first masking material and define the first masking layer 118. In some embodiments, the first masking material may be formed to a thickness of between approximately 250 angstroms and approximately 350 angstroms. Such a thickness of the first masking material prevents damage to the underlying contact layer 1008.

Figure 12:
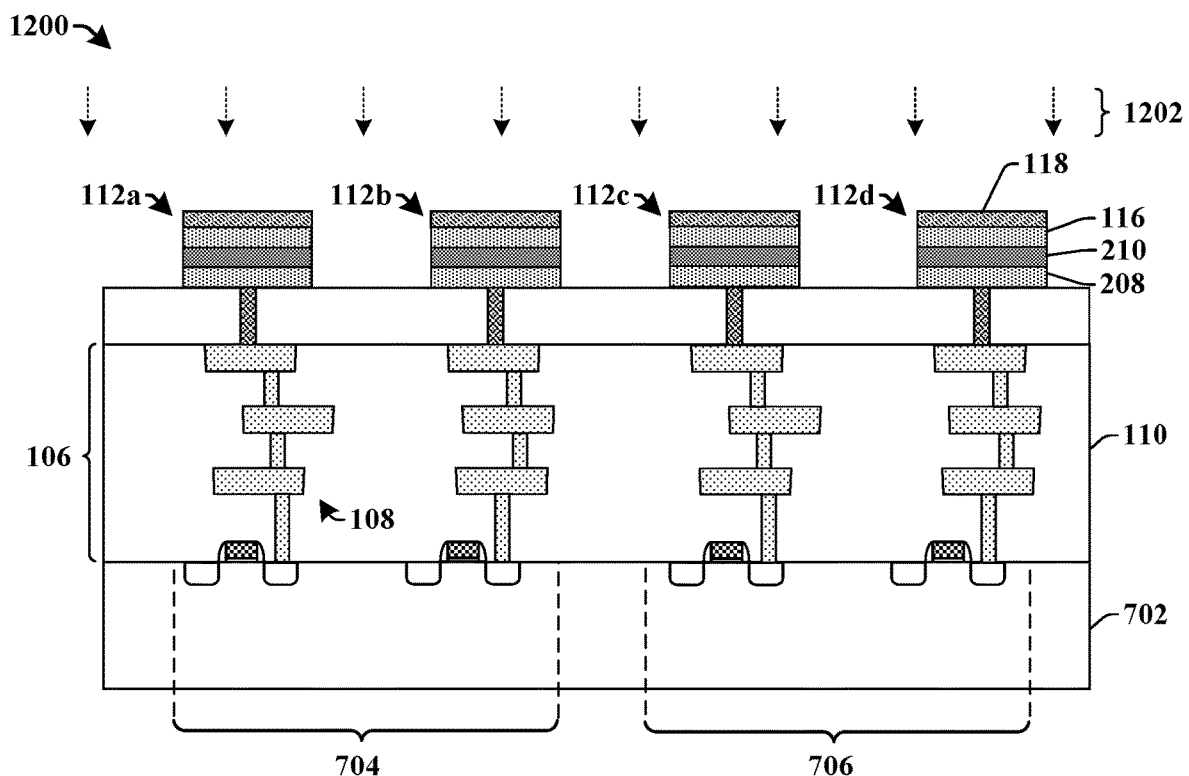

As shown in cross-sectional view 1200 of FIG. 12, the bond pad stack (1002 of FIG. 11) is patterned to define a plurality of bond pad structures 112a-112d. In some embodiments, the bond pad stack (1002 of FIG. 11) may be patterned by selectively exposing the bond pad stack to an etchant 1202 according to the first masking layer 118. In some embodiments, the etchant 1202 may comprise a dry etchant (e.g., having a chlorine based chemistry).

Figure 13:
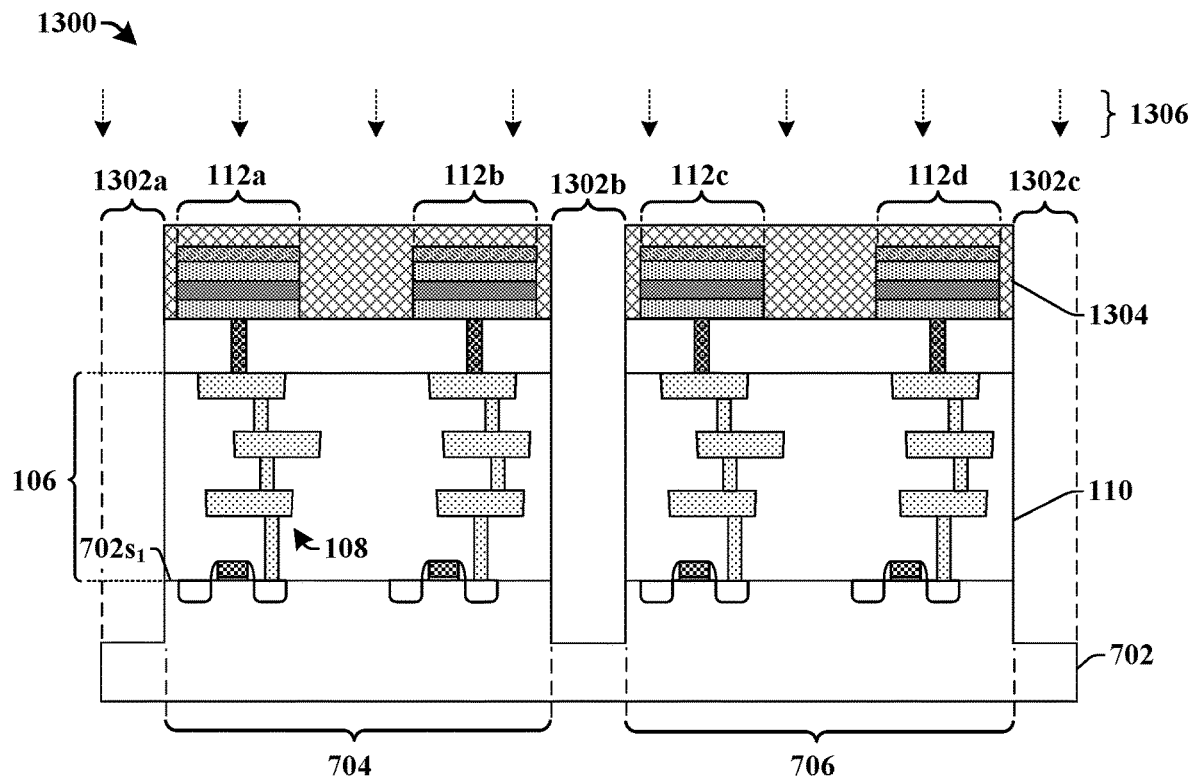

As shown in cross-sectional view 1300 of FIG. 13, the dielectric structure 110 and the semiconductor body 702 are patterned to define trenches 1302a-1302c extending into the first side 702si of the semiconductor body 702. The trenches 1302a-1302c comprise a first trench 1302a disposed along a first side of the first integrated chip region 704, a second trench 1302b disposed between a second side of the first integrated chip region 704 and a first side of the second integrated chip region 706, and a third trench 1302c disposed along a second side of the second integrated chip region 706.

In some embodiments, the dielectric structure 110 and the semiconductor body 702 may be patterned by selectively exposing the dielectric structure 110 and the semiconductor body 702 to an etchant 1306 according to a trench masking layer 1304. The trench masking layer 1304 extends over the plurality of bond pad structures 112a-112d and comprises sidewalls that define openings disposed between adjacent ones of the integrated chip die regions 704-706. In some embodiments, the trench masking layer 1304 may comprise an oxide, a nitride, a carbide, or the like. In some embodiments, the etchant 1306 may comprise a dry etchant. In some embodiments, the etchant 1306 may be part of a deep reactive ion etching process (e.g., a Bosch etch process). The trench masking layer 1304 may be removed after patterning of the dielectric structure 110 and the semiconductor body 702.

Figure 14:
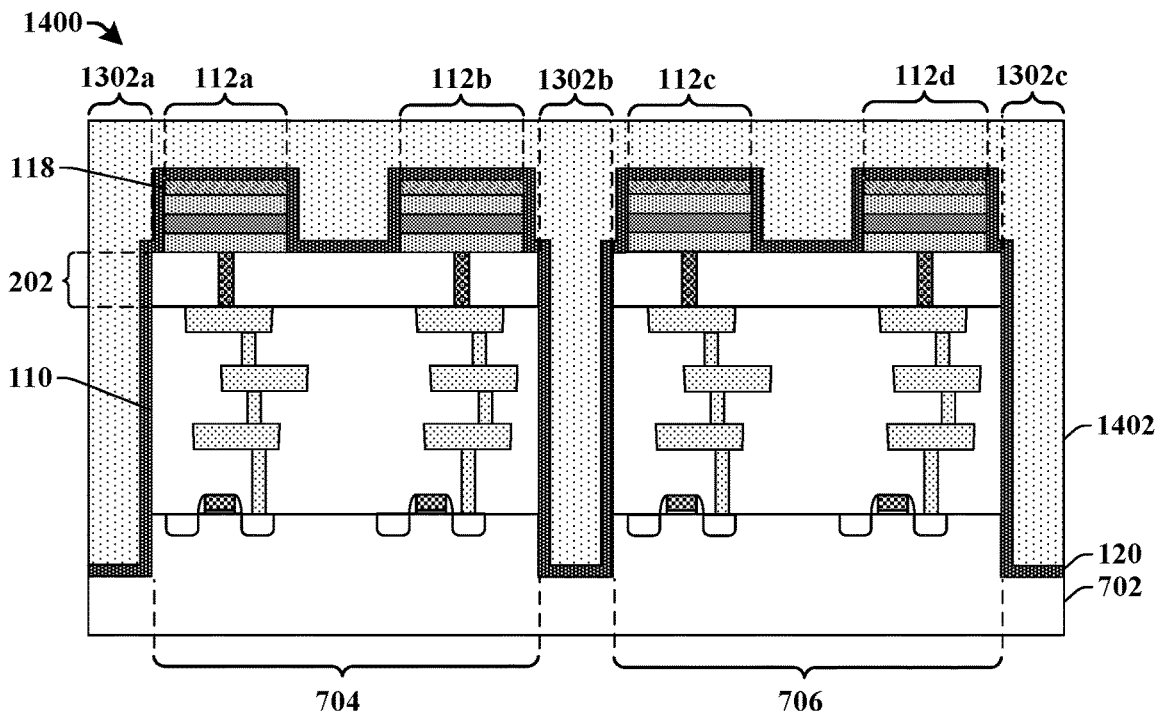

As shown in cross-sectional view 1400 of FIG. 14, a second masking layer 120 is formed over the first masking layer 118, and along sidewalls of the plurality of bond pad structures 112a-112d, the redistribution structure 202, the dielectric structure 110, and the semiconductor body 702 that define the trenches 1302a-1302c. In some embodiments, the second masking layer 120 may comprise a metal-oxide, such as aluminum oxide, for example. In some embodiments, the second masking layer 120 may be formed by way of a deposition process (e.g., CVD, PE-CVD, PVD, or the like). In some embodiments, the second masking layer 120 may be formed to a thickness of between approximately 250 angstroms and approximately 350 angstroms. Such a thickness of the second masking layer 120 prevents damage to the underlying layers during a subsequent exposure to a fluorine based etchant.

A dielectric fill material 1402 is formed over the second masking layer 120. The dielectric fill material 1402 fills the trenches 1302a-1302c and extends over top surfaces of the plurality of bond pad structures 112a-112d. In some embodiments, the dielectric fill material 1402 may comprise an oxide (e.g., silicon oxide), a nitride, or the like. In some embodiments, the dielectric fill material 1402 may be formed by way of a deposition process (e.g., CVD, PE-CVD, PVD, or the like).

Figure 15:
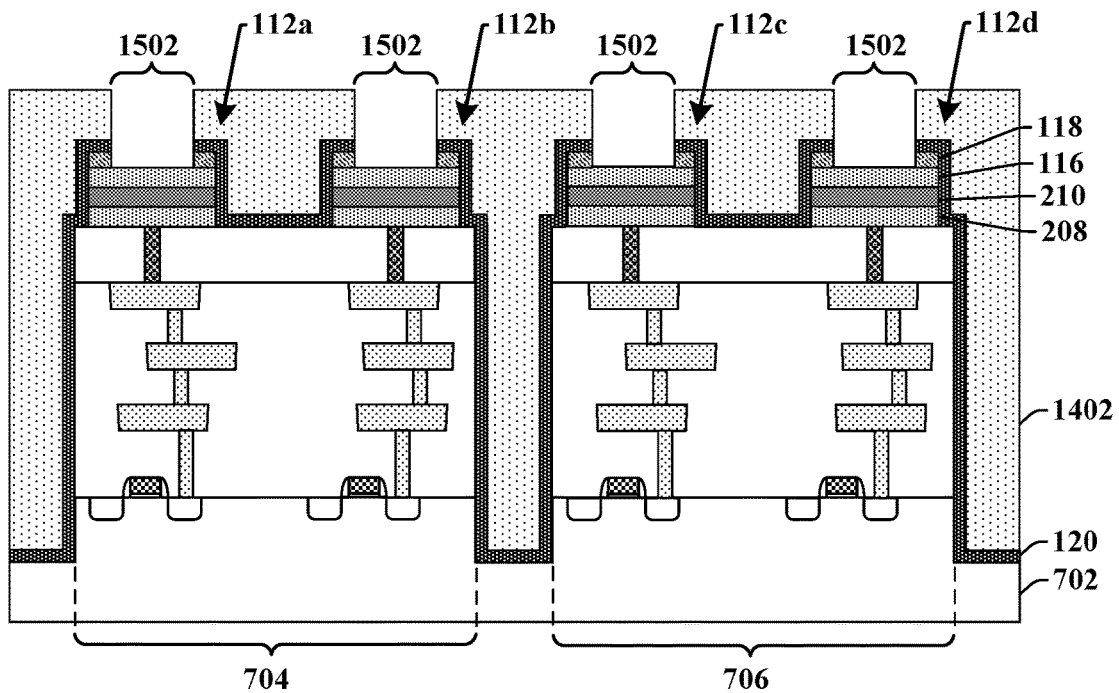

As shown in cross-sectional view 1500 of FIG. 15, the dielectric fill material 1402, the second masking layer 120, and the first masking layer 118 are patterned to define openings 1502 that expose the contact layer 116 within respective ones of the plurality of bond pad structures 112a-112d. In some embodiments the dielectric fill material 1402, the second masking layer 120, and the first masking layer 118 may be selectively patterned using a photolithographic process and a dry etching process.

Figure 16:
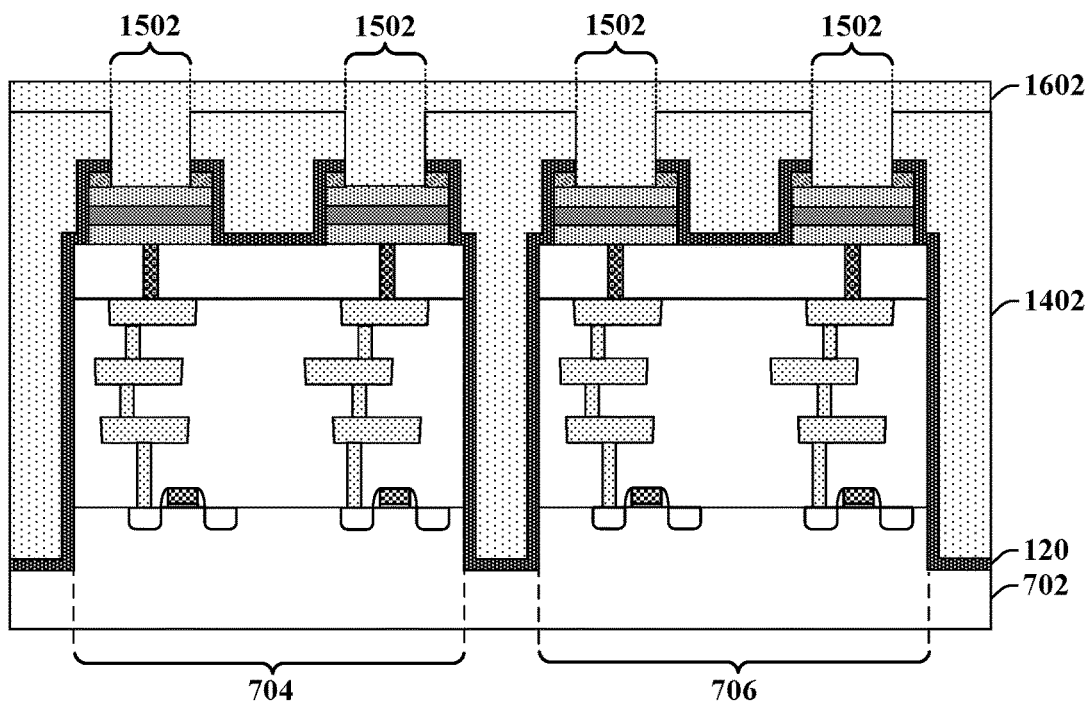

As shown in cross-sectional view 1600 of FIG. 16 an additional dielectric material 1602 is formed over the dielectric fill material 1402. The additional dielectric material 1602 fills in the openings 1502 in the dielectric fill material 1402. In some embodiments, the additional dielectric material 1602 may comprise an oxide formed by way of a deposition process (e.g., CVD, PE-CVD, PVD, or the like). In some embodiments, after the additional dielectric material 1602 is deposited, a planarization process (e.g., a chemical mechanical planarization (CMP) process) may be performed so that the dielectric fill material 1402 and/or the additional dielectric material 1602 define a substantially flat surface overlying the semiconductor body 702.

Figure 17:
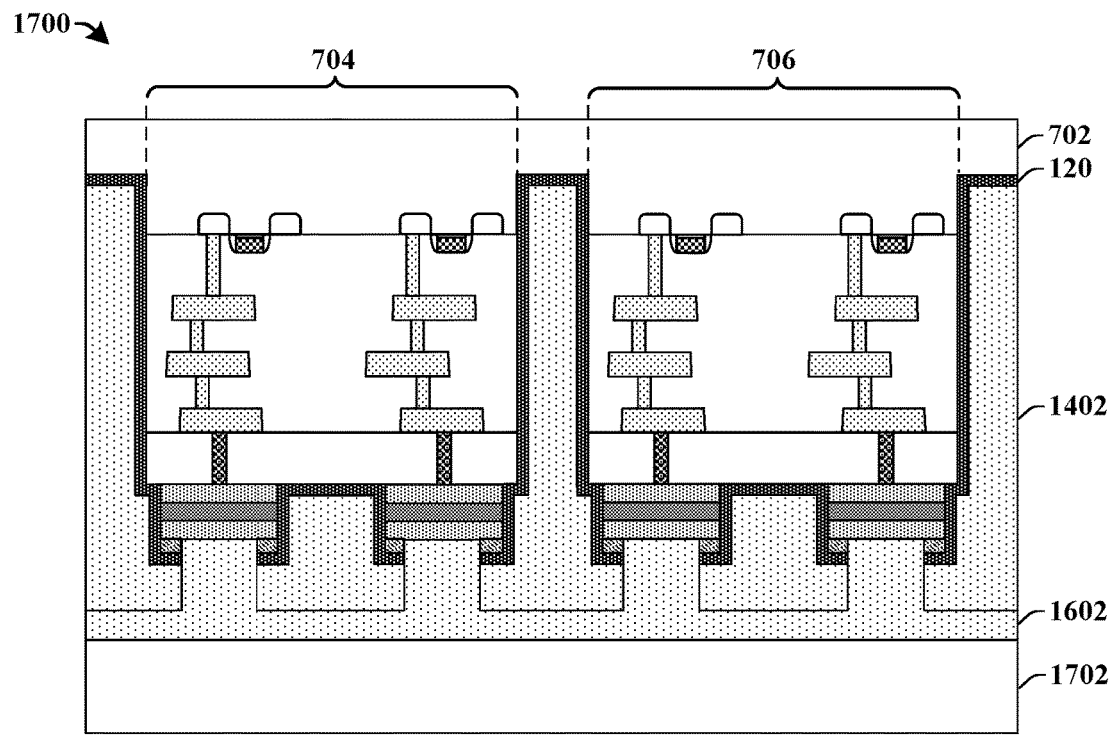

As shown in cross-sectional view 1700 of FIG. 17, the dielectric fill material 1402 and the additional dielectric material 1602 are bonded to a carrier substrate 1702. In some embodiments, the dielectric fill material 1402 and the additional dielectric material 1602 may be bonded to the carrier substrate 1702 by way of a fusion bonding process. In some embodiments, the fusion bonding process is performed by bringing the carrier substrate 1702 into contact with the dielectric fill material 1402 and/or the additional dielectric material 1602 at an elevated temperature (e.g., a temperature greater than approximately 500° C.).

Figure 18:
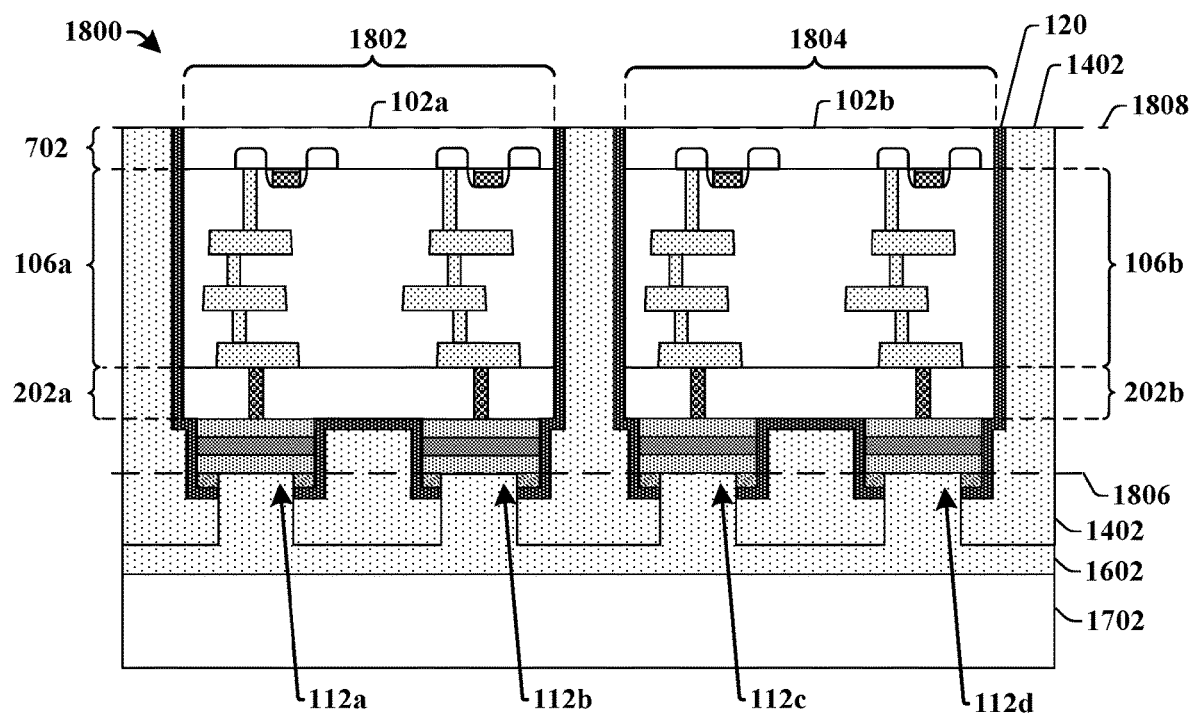

As shown in cross-sectional view 1800 of FIG. 18, a part of the semiconductor body (702 of FIG. 17) is removed to thin the semiconductor body. Thinning the semiconductor body exposes both the dielectric fill material 1402 and the second masking layer 120 within the trenches (1302a-1302c of FIG. 14) and defines a plurality of integrated chip die 1802-1804. The plurality of integrated chip die 1802-1804 comprise a first integrated chip die 1802 and a second integrated chip die 1804. The first integrated chip die 1802 has a first dielectric structure 106a disposed over a first substrate 102a. The first dielectric structure 106a is coupled to bond pad structures 112a-112b by way of a first redistribution structure 202a. The second integrated chip die 1804 has a second dielectric structure 106b disposed over a second substrate 102b. The second dielectric structure 106b is coupled to bond pad structures 112c-112d by way of a second redistribution structure 202b.

In some embodiments, the part of the semiconductor body (702 of FIG. 17) may be removed by operating upon a back-side of the semiconductor body with an etching process, a mechanical grinding process, a chemical mechanical polishing process, or the like. Removing the part of the semiconductor body causes the dielectric fill material 1402 to continuously extend between a first horizontal line 1806 extending along a top of the bond pad structures 112a-112d and a second horizontal line 1808 extending along a bottommost surface of the plurality of integrated chip die 1802-1804.

Figure 19A:
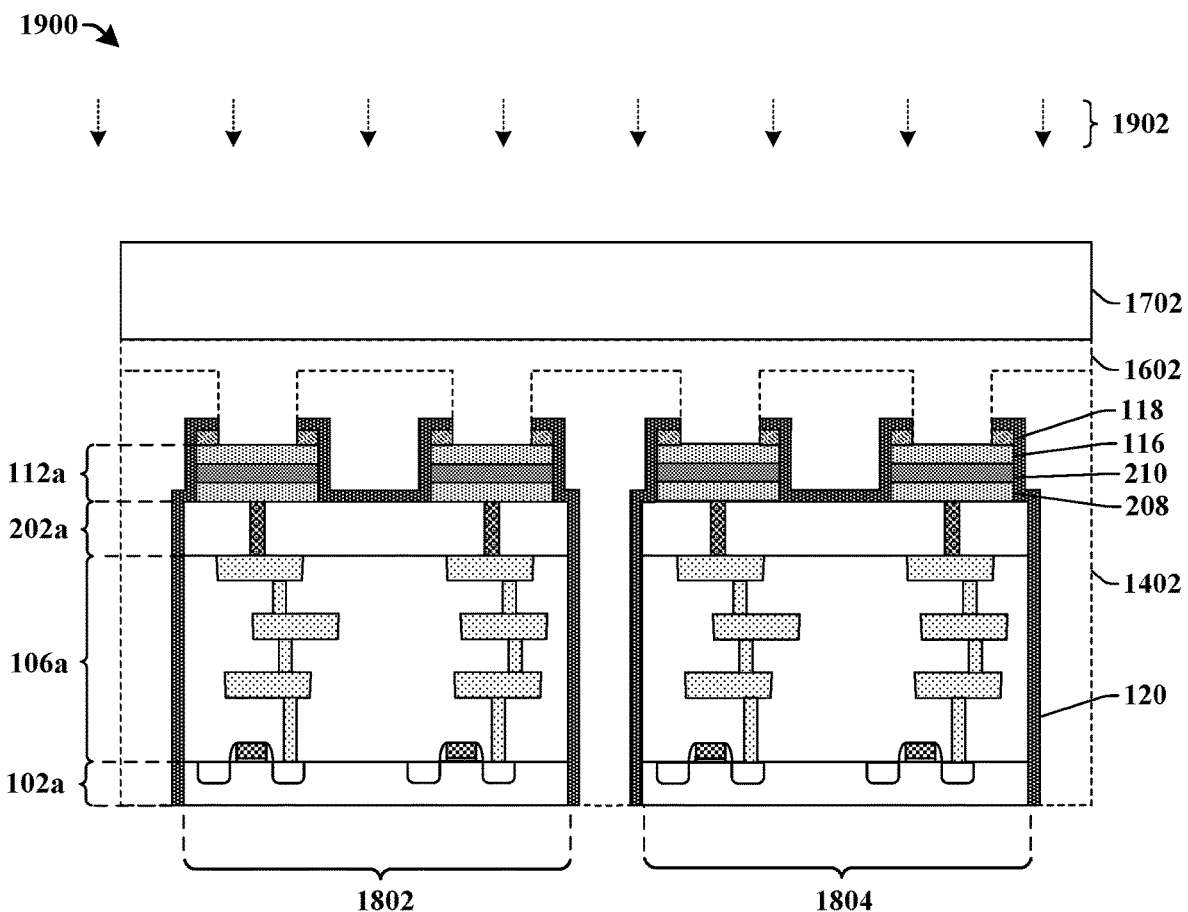

As shown in cross-sectional view 1900 of FIG. 19A, the dielectric fill material 1402 and the additional dielectric material 1602 are removed to separate the plurality of integrated chip die 1802-1804 from one another and from the carrier substrate 1702. In some embodiments, the dielectric fill material 1402 and the additional dielectric material 1602 may be removed using an etchant 1902 comprising a vapor hydrofluoric acid (VHF). The second masking layer 120 prevents the VHF from damaging the plurality of integrated chip die 1802-1804. Furthermore, the contact layer 116 has a low reactivity with fluorine based etchants, thereby preventing the VHF from forming a fluorine based byproduct on the contact layer 116 (so that the contact layer 116 has an upper surface that does not have a fluorine based byproduct) and maintaining a low resistance (e.g., less than approximately 12 ohms).

Figure 19B:
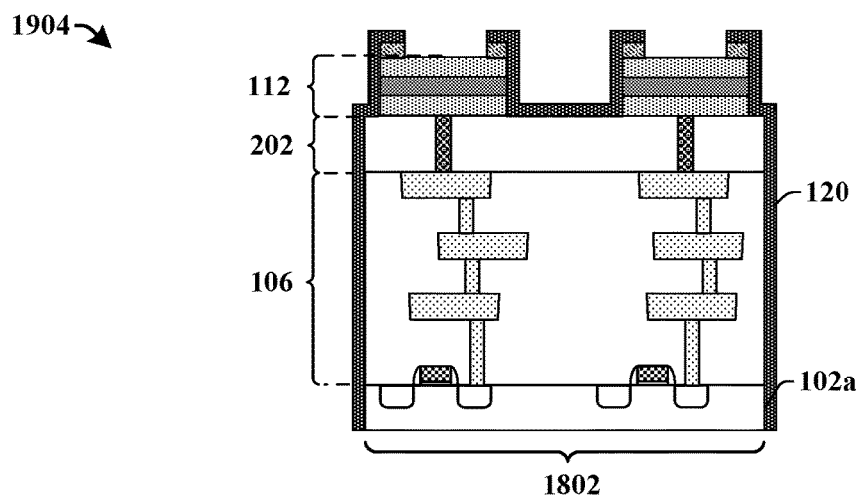

Cross-sectional view 1904 of FIG. 19B illustrates a cross-sectional view of an integrated chip die 1802 after removal of the dielectric fill material 1402 and the additional dielectric material 1602.

FIGS. 20A-21D illustrate cross-sectional views of some embodiments of packaging processes used to package one or more of the plurality of integrated chip die 1802-1804. It will be appreciated that the packaging processes of FIGS. 20A-21D are non-limiting examples of packaging processes that may be used to package one or more of the plurality of integrated chip die 1802-1804.

Figure 20A:
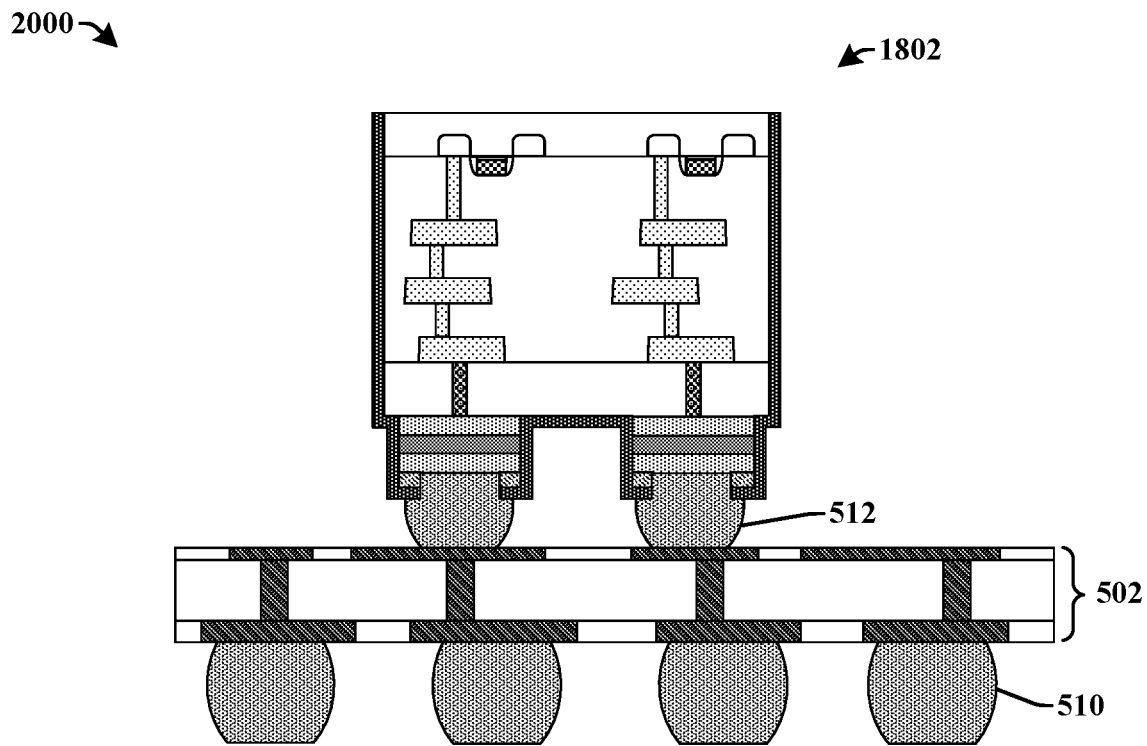
Figure 20B:
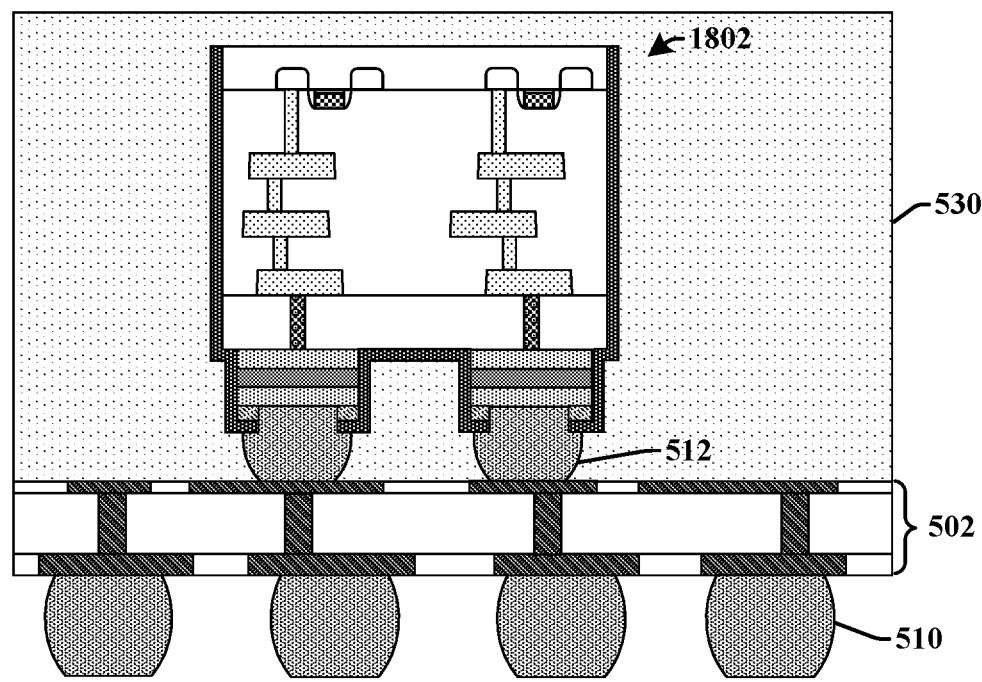

FIGS. 20A-20B illustrate cross-sectional views of some embodiments of a packaging process used to package one or more of the plurality of integrated chip die 1802-1804.

As shown in cross-sectional view 2000 of FIG. 20A, an integrated chip die 1802 is bonded to a package substrate 502 by way of one or more bump structures 512. The one or more bump structures 512 are formed over the package substrate 502 to enable the package substrate 502 to be coupled to the integrated chip die 1802. In various embodiments, the one or more bump structures 512 may comprise solder bumps, copper posts, micro-bumps (having widths in a range from about 5 µm to about 30 µm), or other applicable bump structures.

As shown in cross-sectional view 2002 of FIG. 20B, a molding compound 530 is formed over the package substrate 502 and around the integrated chip die 1802. In some embodiments, the molding compound 530 may comprise an epoxy, an epoxy with thermally conductive filler materials, organic cylinders, plastic molding compound, plastic molding compound with fiber, or other suitable material. In some embodiments, the molding compound 530 is formed by a spin-on coating process, an injection molding process, and/or the like.

FIGS. 21A-21D illustrate cross-sectional views of some alternative embodiments of a packaging process used to package one or more of the plurality of integrated chip die 1802-1804.

Figure 21A:
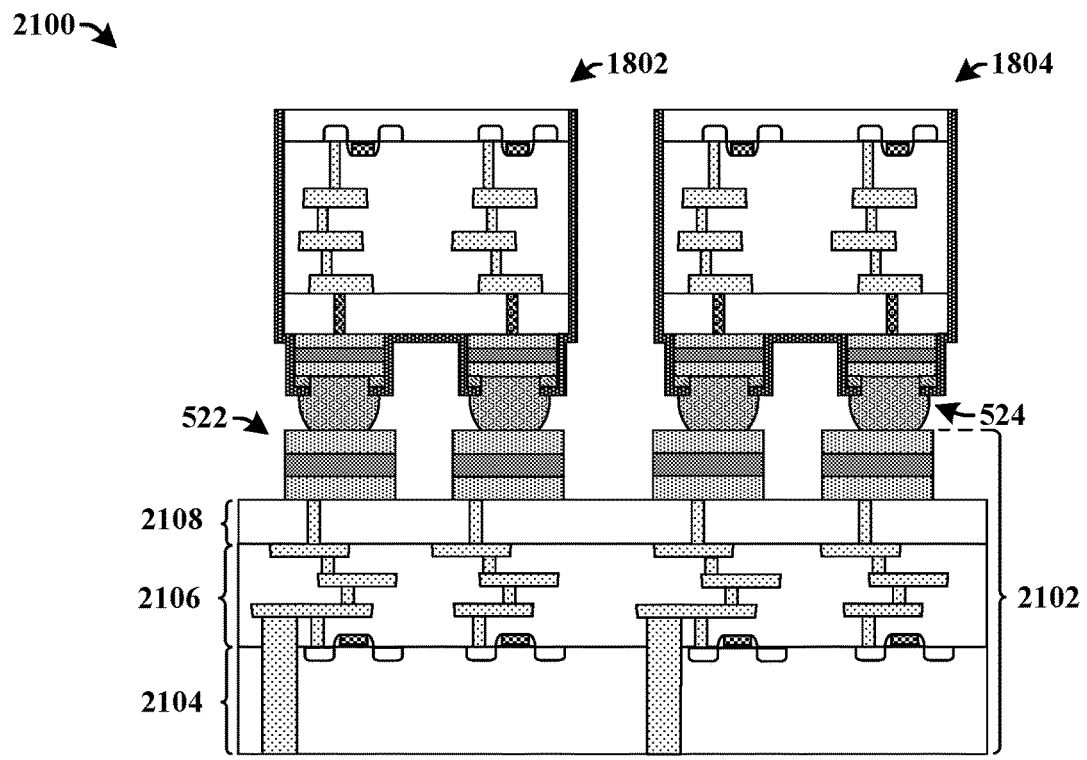

As shown in cross-sectional view 2100 of FIG. 21A, the plurality of integrated chip die 1802-1804 are bonded to a wafer 2102 by way of a plurality of bump structures 524. In various embodiments, the plurality of bump structures 524 may comprise solder bumps, copper posts, micro-bumps, or other applicable bump structures. The wafer 2102 comprises an interconnect structure 2106 disposed over a substrate 2104. A redistribution structure 2108 couples the interconnect structure 2106 to a plurality of bond pads 522.

Figure 21B:
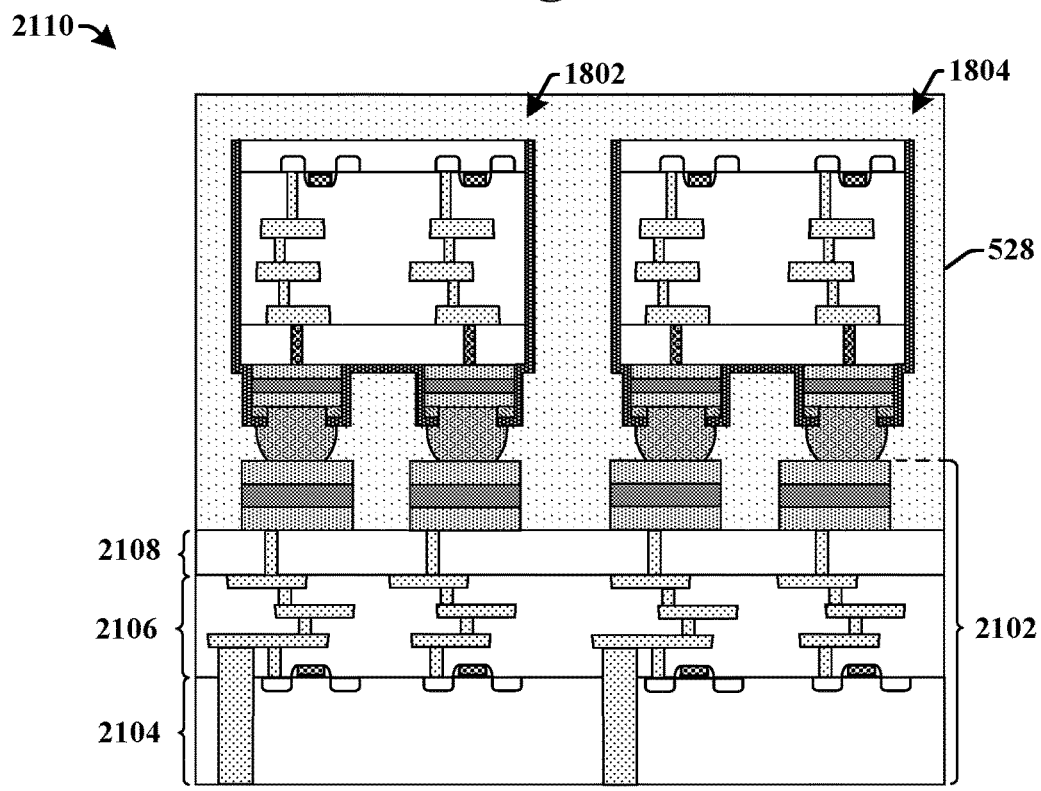

As shown in cross-sectional view 2110 of FIG. 21B, a dielectric material 528 is formed over the wafer 2102 and around the plurality of integrated chip die 1802-1804. In some embodiments, the dielectric material 528 may comprise an oxide. In other embodiments, the dielectric material 528 may comprise an epoxy, a polymer, or other suitable material.

Figure 21D:
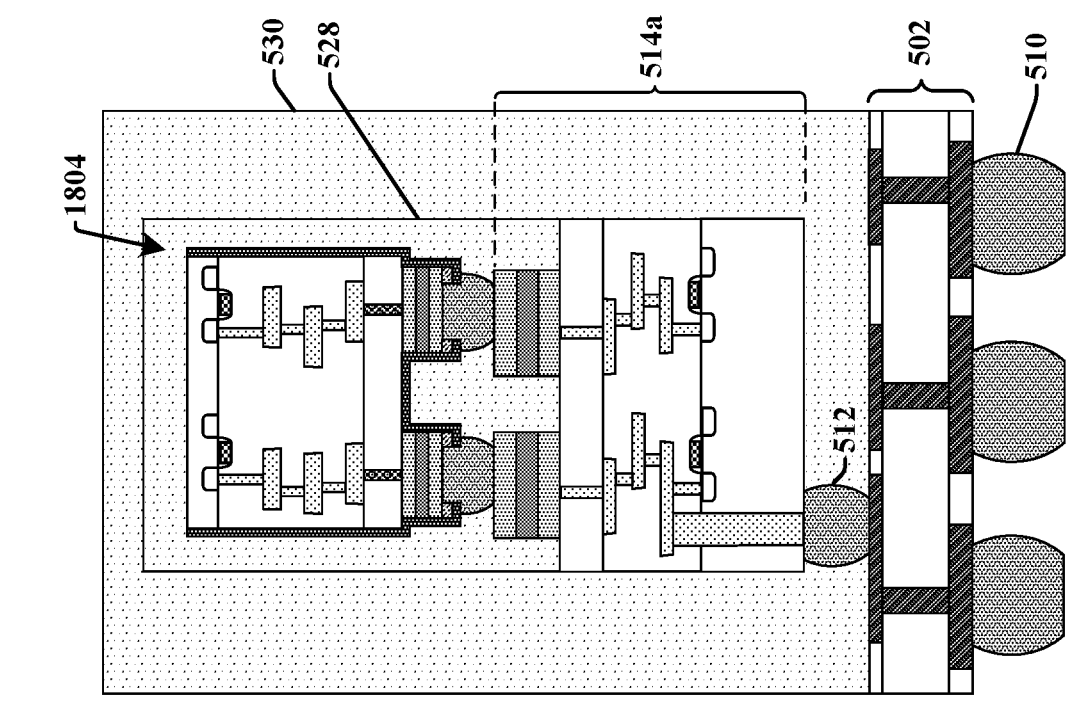
Figure 21C:
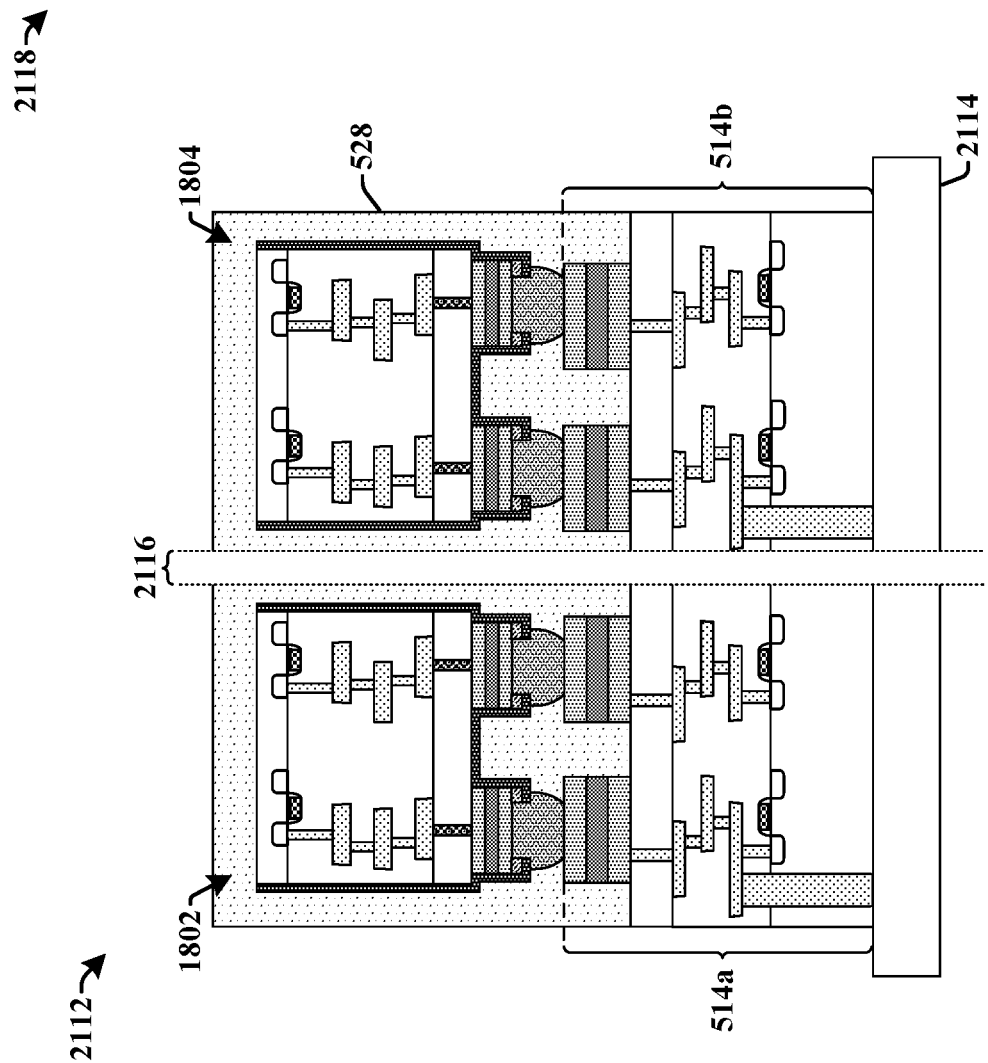

As shown in cross-sectional view 2112 of FIG. 21C, the wafer (2102 of FIG. 21B) is singulated to form a plurality of integrated chip die 514a-514b. In some embodiments, the wafer (2102 of FIG. 21B) may be singulated by a dicing process that mounts the wafer onto a sticky surface of a piece of dicing tape 2114. A wafer saw then cuts the wafer along scribe lines 2116 to separate the wafer into separate integrated chip die 514a-514b. In some embodiments (not shown), the wafer (2102 of FIG. 21B) may have a crack-stop disposed within the interconnect structure 2106 on opposing sides of the scribe lines 2116. The crack-stop is a dense arrangement of interconnect layers that prevent the propagation of cracks caused by the dicing process.

As shown in cross-sectional view 2118 of FIG. 21D, one of the plurality of integrated chip die 514a is bonded to a package substrate 502 by way of one or more bump structures 512. The one or more bump structures 512 are formed over the package substrate 502 to enable the package substrate 502 to be coupled to the integrated chip die 1802. In various embodiments, the one or more bump structures 512 may comprise solder bumps, copper posts, micro-bumps (having widths in a range from about 5 µm to about 30 µm), or other applicable bump structures.

A molding compound 530 is formed over the package substrate 502 and around the integrated chip die 1802. In some embodiments, the molding compound 530 may comprise an epoxy, an epoxy with thermally conductive filler materials, organic cylinders, plastic molding compound, plastic molding compound with fiber, or other suitable material. In some embodiments, the molding compound 530 is formed by a spin-on coating process, an injection molding process, and/or the like.

Figure 22:
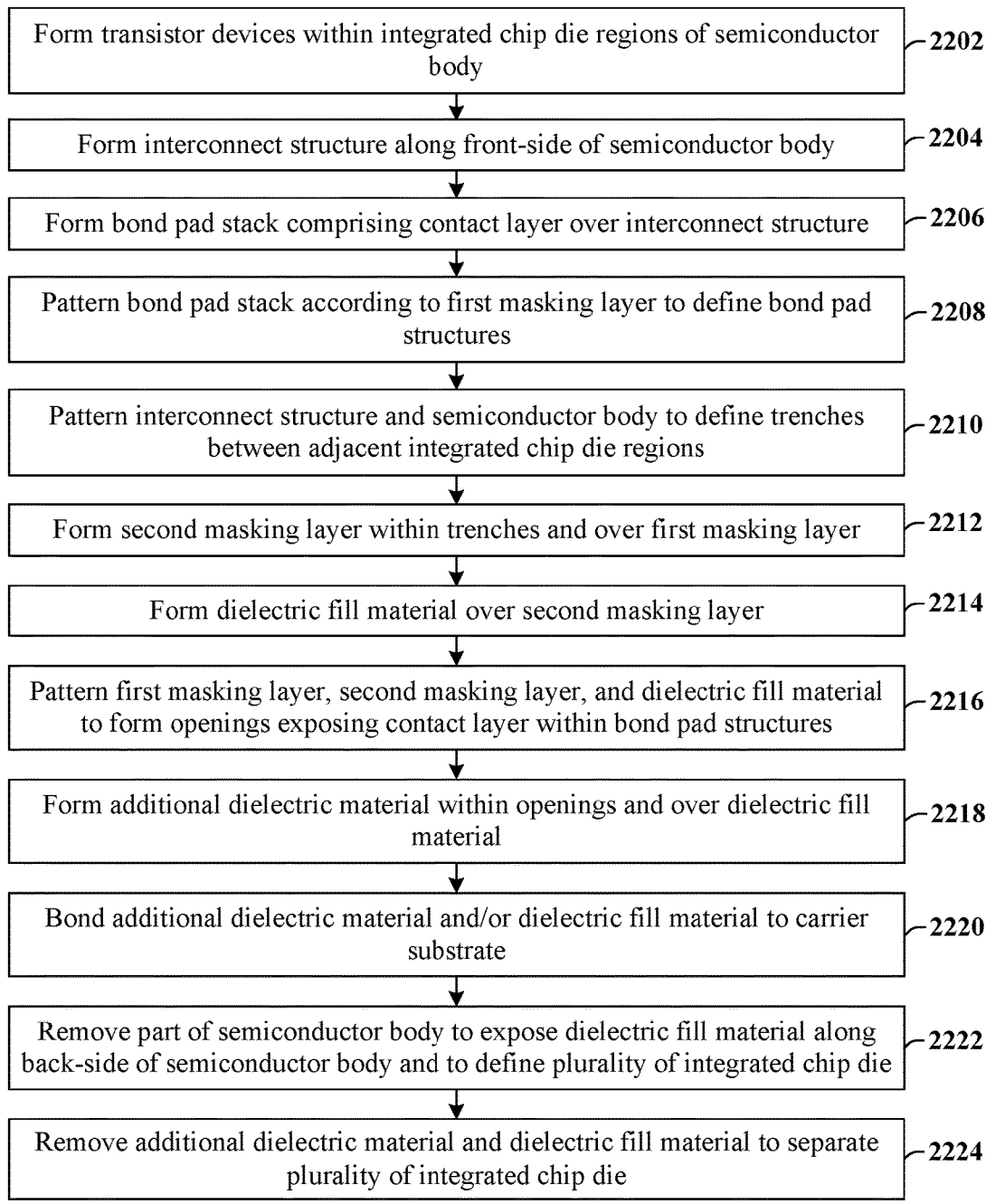
FIG. 22 illustrates a flow diagram of some embodiments of a method of forming an integrated chip die having a bond pad structure comprising a contact layer that is resistant to fluorine based etchants.

FIG. 22 illustrates a flow diagram of some embodiments of a method 2200 of forming an integrated chip die having a bond pad structure comprising a contact layer that is resistant to fluorine based etchants.

While method 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, transistor devices are formed within integrated chip die regions of a semiconductor body. FIG. 7 illustrates a cross-sectional view 700 of some embodiments corresponding to act 2202.

At 2204, an interconnect structure is formed along a front-side of the semiconductor body. FIG. 8 illustrates a cross-sectional view 800 of some embodiments corresponding to act 2204.

At 2206, a bond pad stack comprising a contact layer is formed over the interconnect structure. In some embodiments, the contact layer may comprise or be titanium. FIG. 10 illustrates a cross-sectional view 1000 of some embodiments corresponding to act 2206.

At 2208, the bond pad stack is patterned according to a first masking layer to define a plurality of bond pad structures. FIGS. 11-12 illustrate cross-sectional views 1100-1200 of some embodiments corresponding to act 2208.

At 2210, the interconnect structure and the semiconductor body are patterned to define trenches extending into the semiconductor body between adjacent integrated chip die regions. FIG. 13 illustrates a cross-sectional view 1300 of some embodiments corresponding to act 2210.

At 2212, a second masking layer is formed within the trenches and over the first masking layer. FIG. 14 illustrates a cross-sectional view 1400 of some embodiments corresponding to act 2212.

At 2214, a dielectric fill material is formed over the second masking layer. FIG. 14 illustrates a cross-sectional view 1400 of some embodiments corresponding to act 2214.

At 2216, the first masking layer, the second masking layer, and the dielectric fill material are patterned to define openings that expose the contact layer within the bond pad structures. FIG. 15 illustrates a cross-sectional view 1500 of some embodiments corresponding to act 2216.

At 2218, an additional dielectric material is formed within the openings and over the dielectric fill material. FIG. 16 illustrates a cross-sectional view 1600 of some embodiments corresponding to act 2218.

At 2220, the additional dielectric material and/or the dielectric fill material is bonded to a carrier substrate. FIG. 17 illustrates a cross-sectional view 1700 of some embodiments corresponding to act 2220.

At 2222, a part of the semiconductor body is removed to expose the dielectric fill material along a back-side of the semiconductor body and to define a plurality of integrated chip die. FIG. 18 illustrates a cross-sectional view 1800 of some embodiments corresponding to act 2222.

At 2224, the dielectric fill material and the additional dielectric fill material are removed to separate the plurality of integrated chip die. FIG. 19 illustrates a cross-sectional view 1900 of some embodiments corresponding to act 2224.

Accordingly, in some embodiments, the present disclosure relates to a method of forming an integrated chip die having a low resistance bond pad structure (e.g., a bond pad structure having a resistance of less than approximately 20 ohms). The method forms the bond pad structure as part of a process that uses deep trenches to singulate a semiconductor body into separate integrated chip die.

In some embodiments, a method of forming an integrated chip, comprising: forming a plurality of bond pad structures over an interconnect structure on a front-side of a semiconductor body, wherein the plurality of bond pad structures respectively comprise a titanium contact layer; patterning the interconnect structure and the semiconductor body to define trenches extending into the semiconductor body; forming a dielectric fill material within the trenches; etching the dielectric fill material to expose the titanium contact layer prior to bonding the semiconductor body to a carrier substrate; thinning the semiconductor body to expose the dielectric fill material along a back-side of the semiconductor body and to form a plurality of integrated chip die; and removing the dielectric fill material to separate the plurality of integrated chip die.

In other embodiments, a method of forming an integrated chip, comprising: forming a bond pad stack over an interconnect structure on a semiconductor body, the bond pad stack comprising a contact layer; patterning the bond pad stack according to a first masking layer to define a plurality of bond pad structures, wherein the first masking layer comprises a metal-oxide; patterning the interconnect structure and the semiconductor body to have sidewalls that define trenches extending into the semiconductor body; forming a dielectric fill material within the trenches; etching the dielectric fill material and the first masking layer to expose the contact layer; removing a part of the semiconductor body so that the dielectric fill material completely extends through the semiconductor body, wherein removing the part of the semiconductor body defines a plurality of integrated chip die; and exposing the dielectric fill material to an etchant to remove the dielectric fill material and separate the plurality of separate integrated chip die.

In yet other embodiments, an integrated chip, comprising: an interconnect structure disposed over a substrate, wherein the interconnect structure comprises a plurality of interconnect layers disposed within a dielectric structure; a bond pad structure disposed over the interconnect structure, wherein the bond pad structure comprises a contact layer; a first masking layer comprising a metal-oxide disposed over the bond pad structure, the first masking layer having interior sidewalls arranged directly over the bond pad structure to define an opening; and a conductive bump arranged within the opening and on the contact layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a plurality of bond pad structures over an interconnect structure on a front-side of a semiconductor body, wherein the plurality of bond pad structures respectively comprise a titanium contact layer;
   patterning the interconnect structure and the semiconductor body to define trenches extending into the semiconductor body;
   forming a dielectric fill material within the trenches;
   etching the dielectric fill material to expose the titanium contact layer prior to bonding the semiconductor body to a carrier substrate;
   thinning the semiconductor body to expose the dielectric fill material along a back-side of the semiconductor body and to form a plurality of integrated chip dies; and
   removing the dielectric fill material to separate the plurality of integrated chip dies.

2. The method of claim 1, further comprising:
   forming a bond pad stack over the interconnect structure; and
   patterning the bond pad stack according to a first masking layer to define the plurality of bond pad structures, wherein the first masking layer comprises a metal-oxide.

3. The method of claim 2, further comprising:
   forming a second masking layer within the trenches and over the first masking layer;
   forming the dielectric fill material over the second masking layer; and
   etching the dielectric fill material, the first masking layer, and the second masking layer to expose the titanium contact layer.

4. The method of claim 3, wherein thinning the semiconductor body further exposes the second masking layer along the back-side of the semiconductor body.

5. The method of claim 3, wherein the first masking layer and the second masking layer comprise a same material.

6. The method of claim 3, wherein the first masking layer and the second masking layer are aluminum-oxide.

7. The method of claim 1, wherein removing the dielectric fill material comprises exposing the dielectric fill material to an etchant comprising a vapor hydrofluoric acid.

8. The method of claim 1, wherein the plurality of bond pad structures respectively comprise:
   a first conductive layer comprising titanium; and
   a diffusion barrier layer comprising titanium nitride and directly contacting a top of the first conductive layer, wherein the titanium contact layer directly contacts a top of the diffusion barrier layer.

9. A method of forming an integrated chip, comprising:
   forming a bond pad stack over an interconnect structure on a semiconductor body, the bond pad stack comprising a contact layer;
   patterning the bond pad stack according to a first masking layer to define a plurality of bond pad structures, wherein the first masking layer comprises a metal-oxide;
   patterning the interconnect structure and the semiconductor body to have sidewalls that define trenches extending into the semiconductor body;
   forming a dielectric fill material within the trenches;
   etching the dielectric fill material and the first masking layer to expose the contact layer;
   removing a part of the semiconductor body so that the dielectric fill material completely extends through the semiconductor body, wherein removing the part of the semiconductor body defines a plurality of integrated chip dies; and
   exposing the dielectric fill material to an etchant to remove the dielectric fill material and separate the plurality of integrated chip dies.

10. The method of claim 9, further comprising:
    bonding a front-side of the semiconductor body to a carrier substrate so that the dielectric fill material is between the front-side of the semiconductor body and the carrier substrate.

11. The method of claim 9, further comprising:
    forming a second masking layer within the trenches and on an upper surface of the first masking layer; and
    etching the dielectric fill material, the first masking layer, and the second masking layer to expose the contact layer.

12. The method of claim 11, wherein removing the part of the semiconductor body further causes the second masking layer to completely extend through the semiconductor body.

13. The method of claim 11, wherein the first masking layer and the second masking layer are aluminum-oxide.

14. The method of claim 11, wherein the first masking layer and the second masking layer are a same material.

15. A method of forming an integrated chip, comprising:
    forming a plurality of bond pad structures over an interconnect structure on a first side of a semiconductor substrate;
    patterning the interconnect structure and the semiconductor substrate to define trenches extending into the semiconductor substrate between adjacent ones of the plurality of bond pad structures;
    forming a fill material within the trenches;
    thinning the semiconductor substrate to expose the fill material along a second side of the semiconductor substrate and to form a plurality of integrated chip dies; and
    removing the fill material to separate the plurality of integrated chip dies.

16. The method of claim 15, further comprising:
    forming a bond pad stack over the interconnect structure; and
    patterning the bond pad stack according to a first masking layer to define the plurality of bond pad structures.

17. The method of claim 15, wherein the fill material is removed after thinning the semiconductor substrate.

18. The method of claim 15, further comprising:
forming a second masking layer within the trenches and over the first side of the semiconductor substrate; and
forming the fill material over the second masking layer, wherein thinning the semiconductor substrate further exposes the second masking layer along the second side of the semiconductor substrate.

19. The method of claim 18, wherein the second masking layer is aluminum-oxide.

20. The method of claim 18, wherein the second masking layer extends along opposing sides of the plurality of bond pad structures.

* * * * *